(12) United States Patent
Huang et al.

(10) Patent No.: US 12,166,092 B2
(45) Date of Patent: *Dec. 10, 2024

(54) METHOD FOR FORMING SOURCE/DRAIN CONTACTS UTILIZING AN INHIBITOR

(71) Applicant: Taiwan Semiconductor Manufacturing Co., Ltd., Hsin-Chu (TW)

(72) Inventors: Lin-Yu Huang, Hsinchu (TW);
Li-Zhen Yu, New Taipei (TW);
Chia-Hao Chang, Hsinchu (TW);
Cheng-Chi Chuang, New Taipei (TW);
Yu-Ming Lin, Hsinchu (TW);
Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/329,126

(22) Filed: Jun. 5, 2023

(65) Prior Publication Data

US 2023/0326983 A1    Oct. 12, 2023

Related U.S. Application Data

(60) Continuation of application No. 17/504,259, filed on Oct. 18, 2021, now Pat. No. 11,670,691, which is a
(Continued)

(51) Int. Cl.
*H01L 29/417* (2006.01)
*H01L 21/28* (2006.01)
*H01L 21/8234* (2006.01)

(52) U.S. Cl.
CPC .. *H01L 29/41725* (2013.01); *H01L 21/28097* (2013.01); *H01L 21/28158* (2013.01); *H01L 21/823475* (2013.01)

(58) Field of Classification Search
CPC ....... H01L 29/08; H01L 29/66; H01L 29/417; H01L 29/665; H01L 29/0847; H01L 29/66545; H01L 29/41725; H01L 29/41766; H01L 27/088; H01L 27/0886; H01L 27/092; H01L 27/0924;
(Continued)

(56) References Cited

U.S. PATENT DOCUMENTS 6,559,015 B1    5/2003  Yu
8,772,109 B2    7/2014  Colinge
(Continued)

*Primary Examiner* — Chuong A Luu
(74) *Attorney, Agent, or Firm* — HAYNES AND BOONE, LLP

(57) ABSTRACT

A device includes a substrate, an isolation structure over the substrate, a gate structure over the isolation structure, a gate spacer on a sidewall of the gate structure, a source/drain (S/D) region adjacent to the gate spacer, a silicide on the S/D region, a dielectric liner over a sidewall of the gate spacer and on a top surface of the isolation structure, wherein a bottom surface of the dielectric liner is above a top surface of the silicide layer and spaced away from the top surface of the silicide layer in a cross-sectional plane perpendicular to a lengthwise direction of the gate structure.

20 Claims, 16 Drawing Sheets

Related U.S. Application Data division of application No. 16/881,481, filed on May 22, 2020, now Pat. No. 11,152,475.

(60) Provisional application No. 62/982,437, filed on Feb. 27, 2020.

(58) Field of Classification Search
CPC . H01L 21/28; H01L 21/285; H01L 21/28097; H01L 21/28518; H01L 21/28158; H01L 21/768; H01L 21/76831; H01L 21/76834; H01L 21/76855; H01L 21/76897; H01L 21/76843; H01L 21/8234; H01L 21/8238; H01L 21/823431; H01L 21/823468; H01L 21/823475; H01L 21/823821; H01L 21/823871
USPC .......................................................... 257/288
See application file for complete search history.

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 11,670,691 B2 * | 6/2023 | Huang .................. H01L 29/665 257/288 |
| 2002/0086467 A1 * | 7/2002 | Chang .................. H01L 27/0255 257/67 |
| 2004/0166631 A1 | 8/2004 | Hurley |
| 2013/0065394 A1 | 3/2013 | Suen et al. |
| 2016/0064518 A1 | 3/2016 | Liu et al. |
| 2019/0096761 A1 | 3/2019 | Nieh et al. |

* cited by examiner

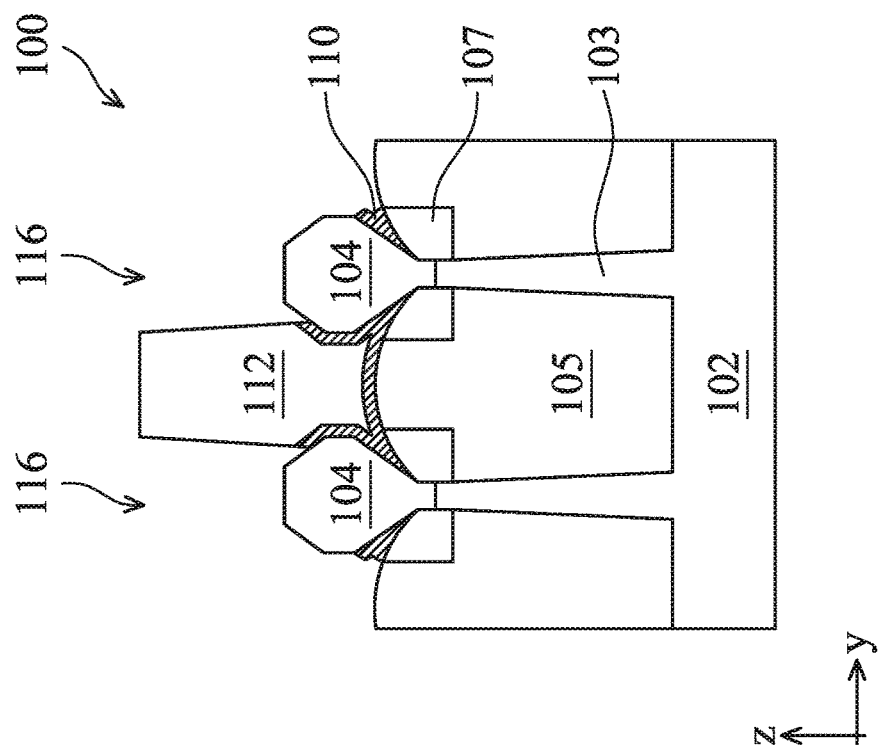
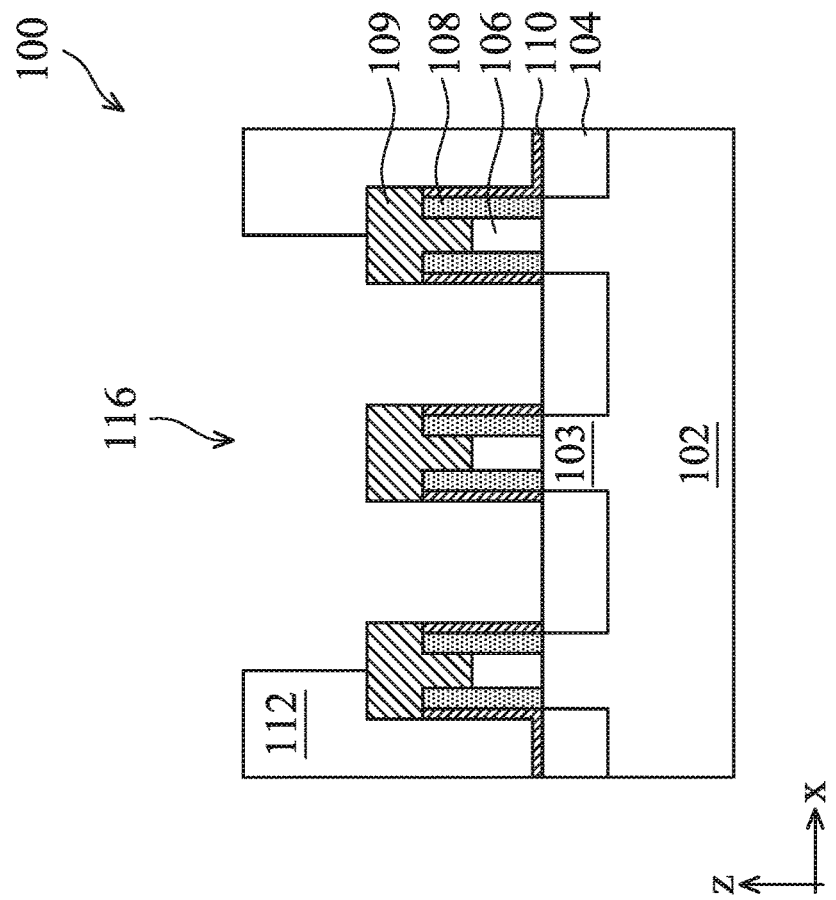
FIG. 3B
FIG. 3A

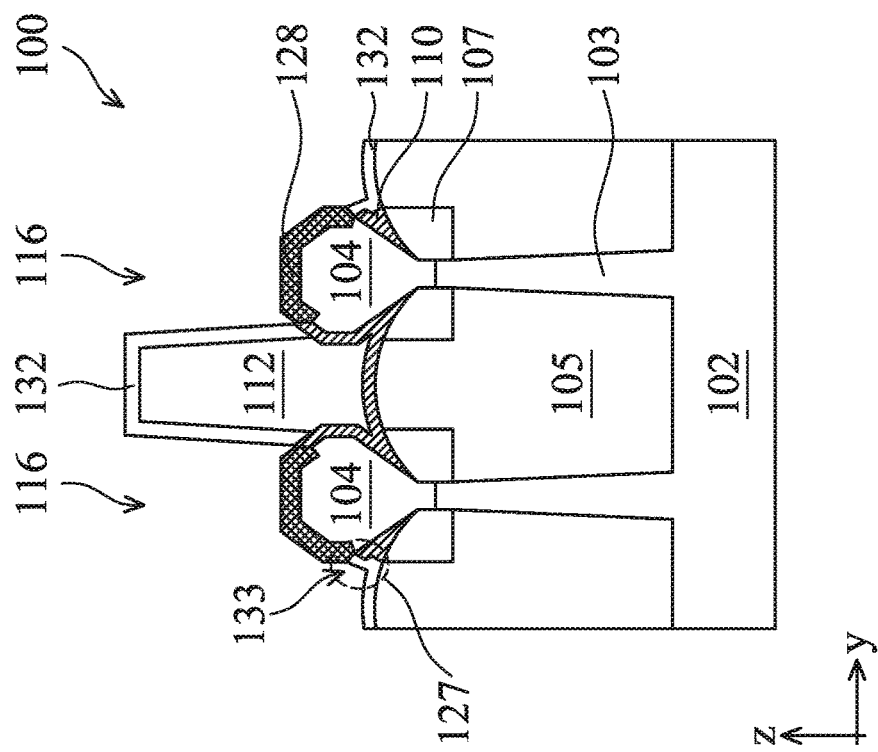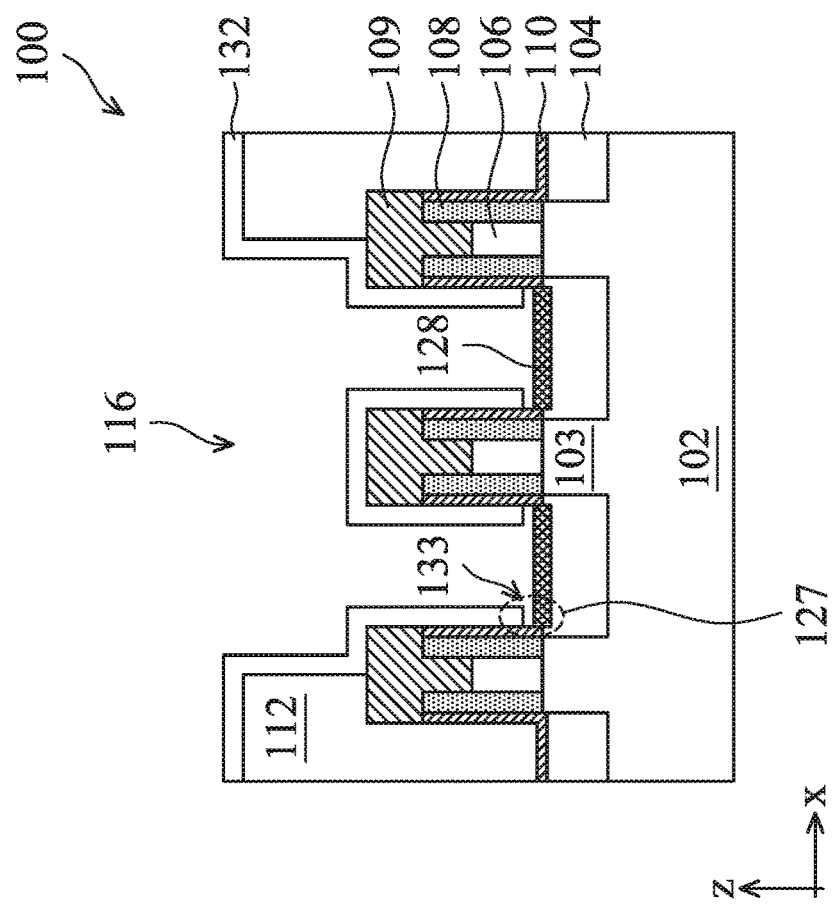
FIG. 7B
FIG. 7A

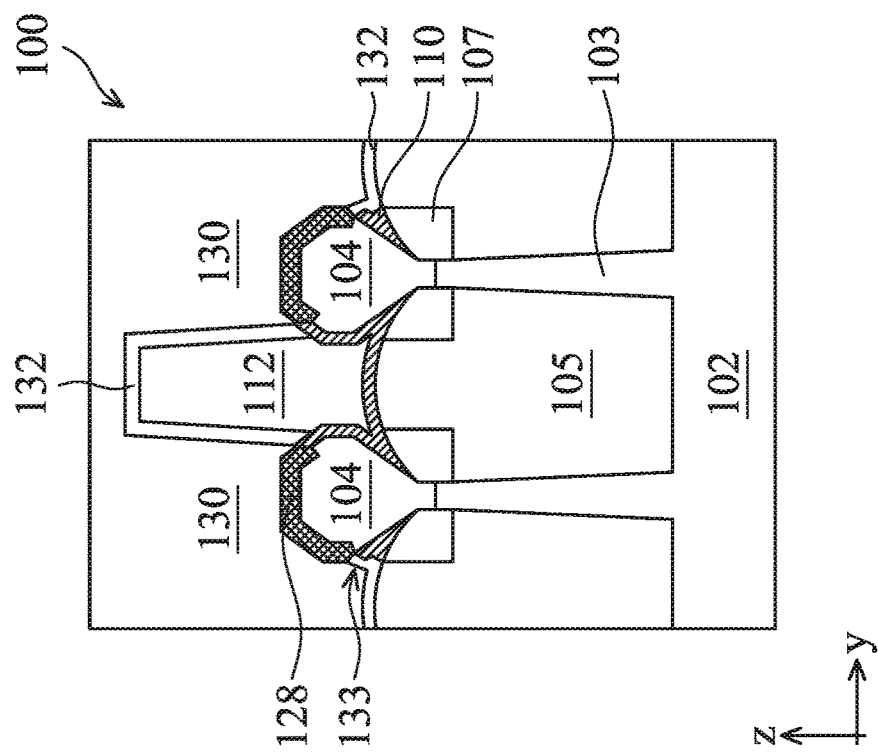
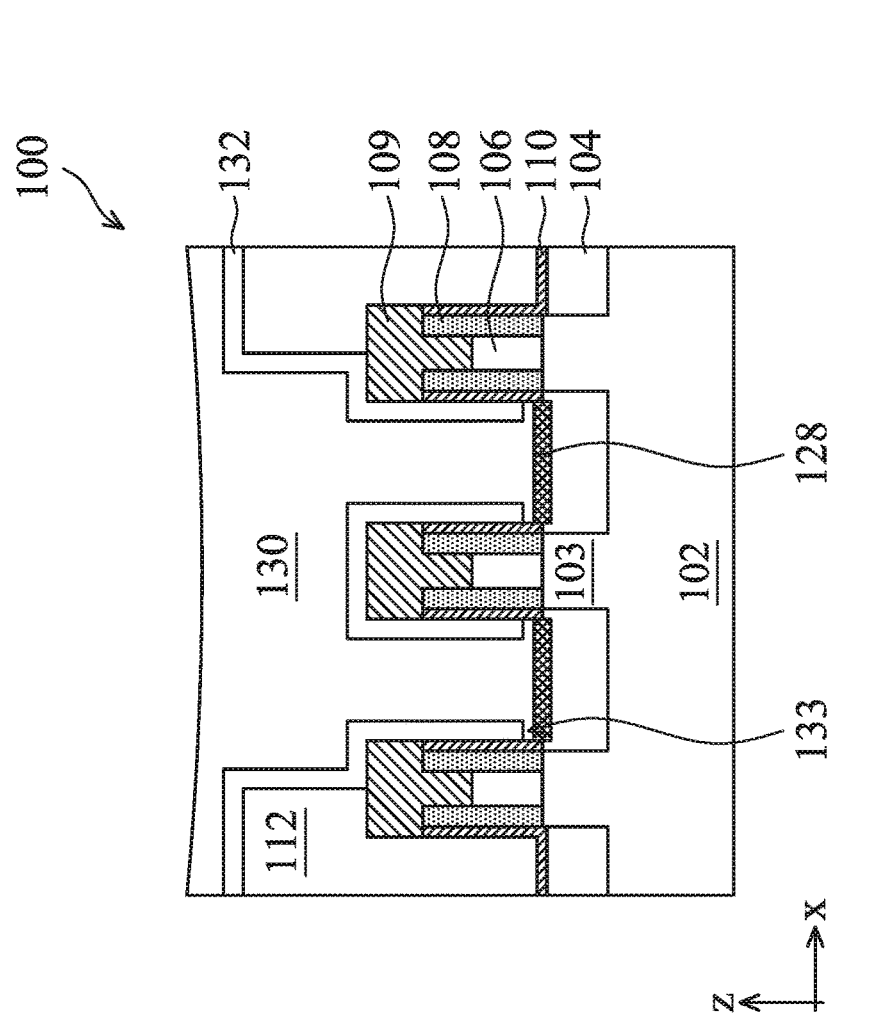
FIG. 8A
FIG. 8B

METHOD FOR FORMING SOURCE/DRAIN CONTACTS UTILIZING AN INHIBITOR

PRIORITY

This is a continuation application of U.S. application Ser. No. 17/504,259, filed Oct. 18, 2021, which is a divisional application of U.S. application Ser. No. 16/881,481, filed May 22, 2020, which claims the benefits of and priority to U.S. Provisional Application No. 62/982,437, filed Feb. 27, 2020, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

For example, when the scaling down continues beyond 32 nm or smaller, increased source/drain (S/D) contact resistance becomes a concern in overall transistor resistance. Further, isolation among nearby S/D contacts also become more important. Methods and structures for reducing S/D contact resistance and increasing isolation among nearby S/D contacts are highly desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3A, 4A, 5A, 6A, 7A, 8A, 9A, 10A, and 11A are cross-sectional views of a portion of a semiconductor device along the A-A line of FIGS. 2A and 2B during various manufacturing stages according to the method in FIGS. 1A and 1B in accordance with embodiments of the present disclosure.

FIGS. 3B, 4B, 5B, 6B, 7B, 8B, 9B, 10B, and 11B are cross-sectional views of a portion of a semiconductor device along the B-B line of FIGS. 2A and 2B during various manufacturing stages according to the method in FIGS. 1A and 1B in accordance with embodiments of the present disclosure.

DETAILED DESCRIPTION

Figure 1A:
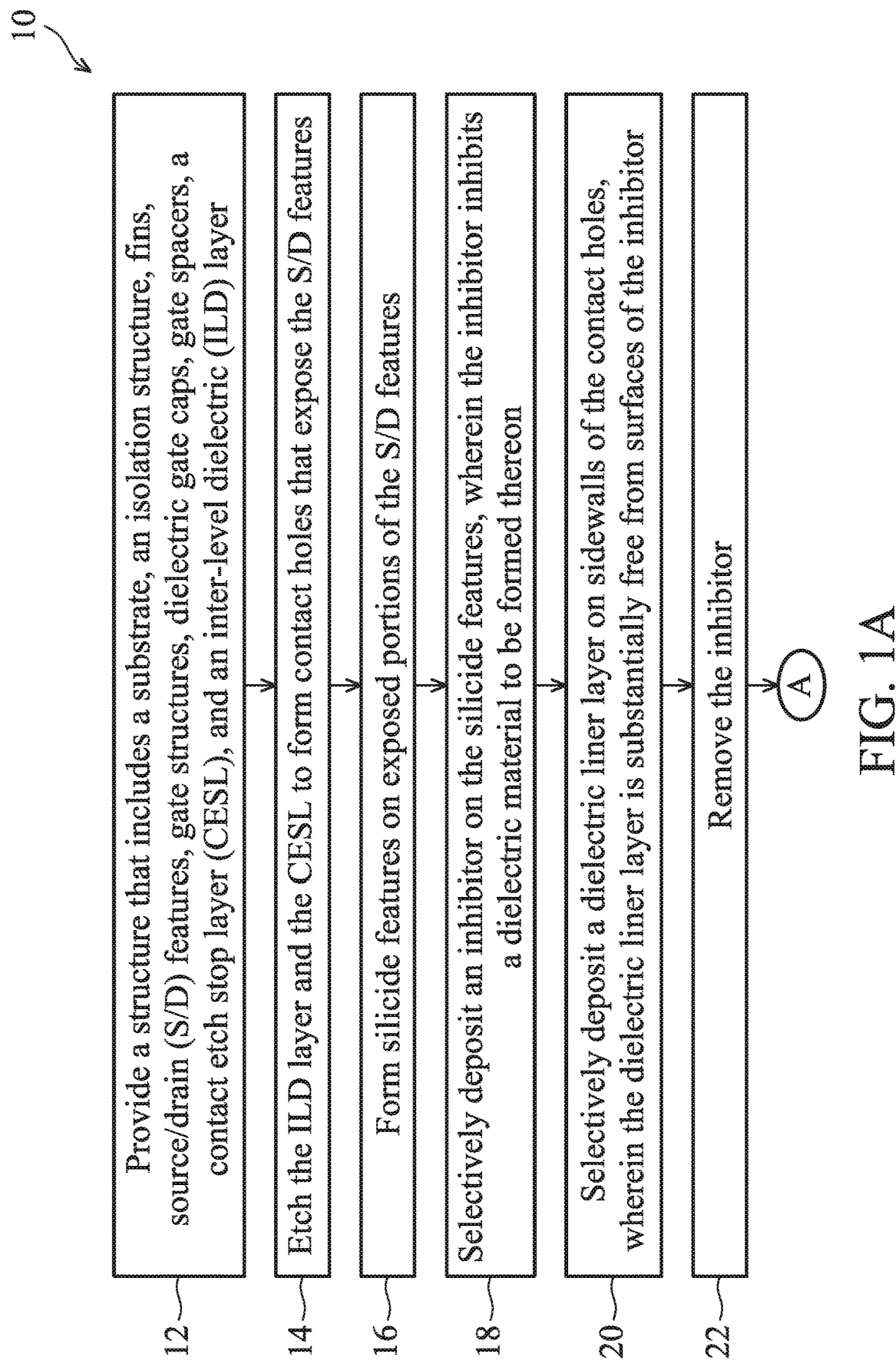
FIGS. 1A and 1B shows a flow chart of a method of forming a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to a semiconductor device and its manufacturing method, and more particularly to source/drain contacts and formation methods thereof. An object of the present disclosure is to enlarge source/drain (S/D) contact areas (thus reducing S/D contact resistance) while keeping good isolation between different S/D contacts as well as between S/D contacts and gates. Another object of the present disclosure is to improve process robustness. To achieve these objects, a process according to the present disclosure includes depositing an inhibitor selectively on S/D silicidation exposed in S/D contact holes. The inhibitor includes an organic film, such as a film having amphiphilic molecules, which inhibits the deposition of a dielectric material thereon. Subsequently, the process forms a S/D dielectric liner layer (or a dielectric liner) on sidewalls of the S/D contact holes. Due to the property of the inhibitor, the dielectric liner layer is free from the top surface of the inhibitor, other than an edge area of the inhibitor. Thus, a vertical etching of the dielectric liner layer is avoided, which generally improves the process's robustness. The process flow further includes removing the inhibitor, which reveals greater surfaces of the silicidation for increased S/D contact area. The process flow further includes depositing one or more metals into the contact holes, and planarizing the one or more metals to form source/drain contacts.

The present disclosure provides one or more of the following advantages. First, it does not require vertical etching of the source/drain liner layer and the etching of the gate. Advantageously, the initial gate can be made shorter to improve the robustness of the overall process. Second, the interfacial area between the source/drain contacts and the silicide increases, thereby reducing source/drain contact resistance These and other aspects of the present disclosure will be further discussed with reference to FIGS. 1A-13.

Figure 1B:
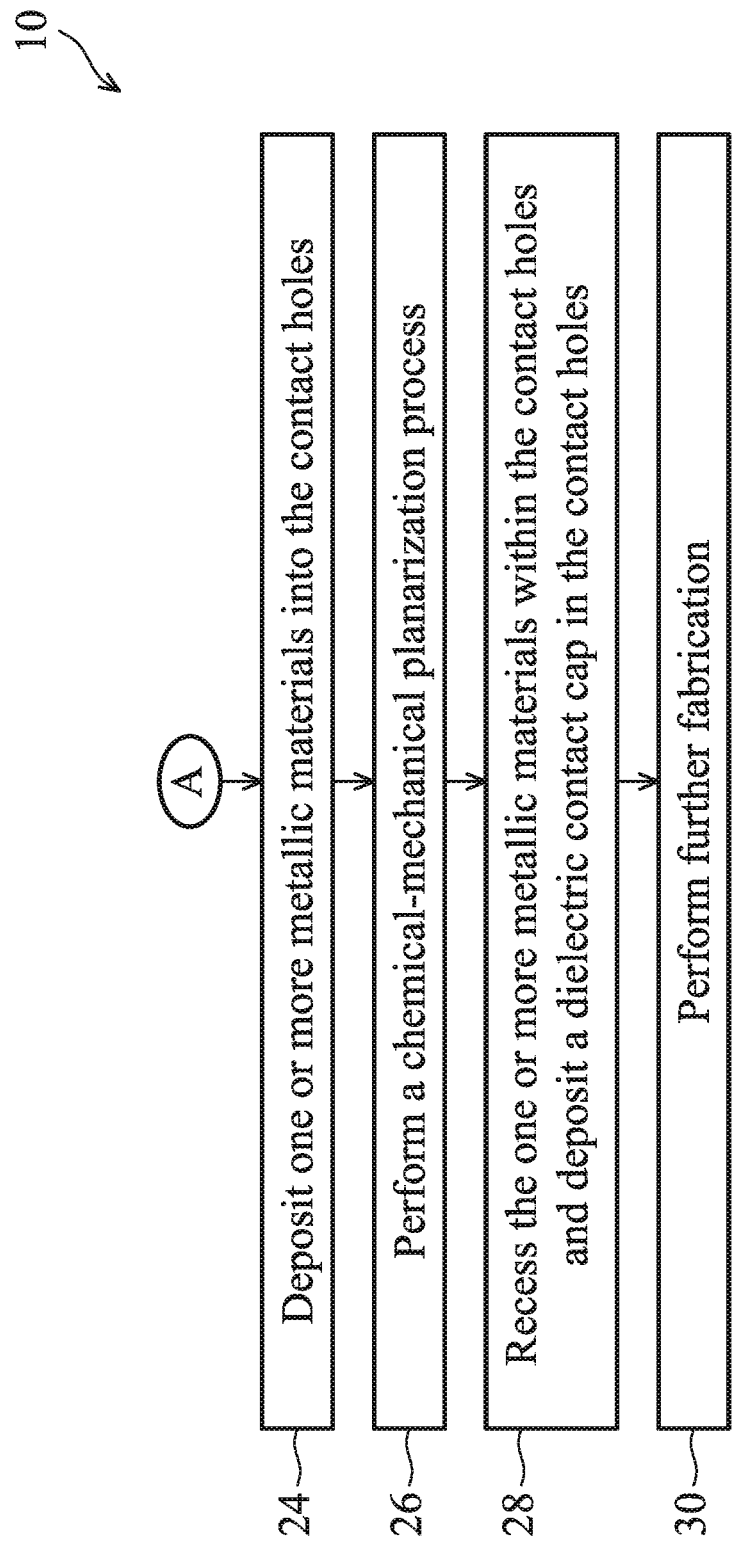

FIGS. 1A and 1B show a flow chart of a method 10 of forming a semiconductor device 100 (or a semiconductor structure 100), according to various aspects of the present disclosure. A top view, a perspective view, and two cross-sectional views of the semiconductor device 100 at a fabrication stage are illustrated in FIGS. 2A, 2B, 2C, and 2D respectively. The method 10 is merely an example, and is not intended to limit the present disclosure beyond what is explicitly recited in the claims. Additional operations can be provided before, during, and after the method 10, and some operations described can be replaced, eliminated, or relocated for additional embodiments of the method. Method 10 is described below in conjunction with FIGS. 2A-13 which illustrate portions of the semiconductor device 100 in various stages of a manufacturing process. Particularly, FIGS. 2C, 3A, 4A, 5A, 6A, 7A, 8A, 9A, 10A, 11A, 12, and 13 are cross-sectional views of a portion of the device 100 along a fin length direction "A-A" of FIGS. 2A and 2B; and FIGS. 2D, 3B, 4B, 5B. 6B, 7B, 8B, 9B, 10B, and 11B are cross-sectional views of the portion of the device 100 along a fin width direction "B-B" of FIGS. 2A and 2B. The semiconductor device 100 is provided for illustration purposes and does not necessarily limit the embodiments of the present disclosure to any number of devices, any number of regions, or any configuration of structures or regions. Furthermore, the semiconductor device 100 may be an intermediate device fabricated during processing of an IC, or a portion thereof, that may comprise static random access memory (SRAM) and/or logic circuits, passive components such as resistors, capacitors, and inductors, and active components such as p-type field effect transistors (PFETs), n-type FETs (NFETs), multi-gate FETs such as FinFETs and gate-all-around devices, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 2A:
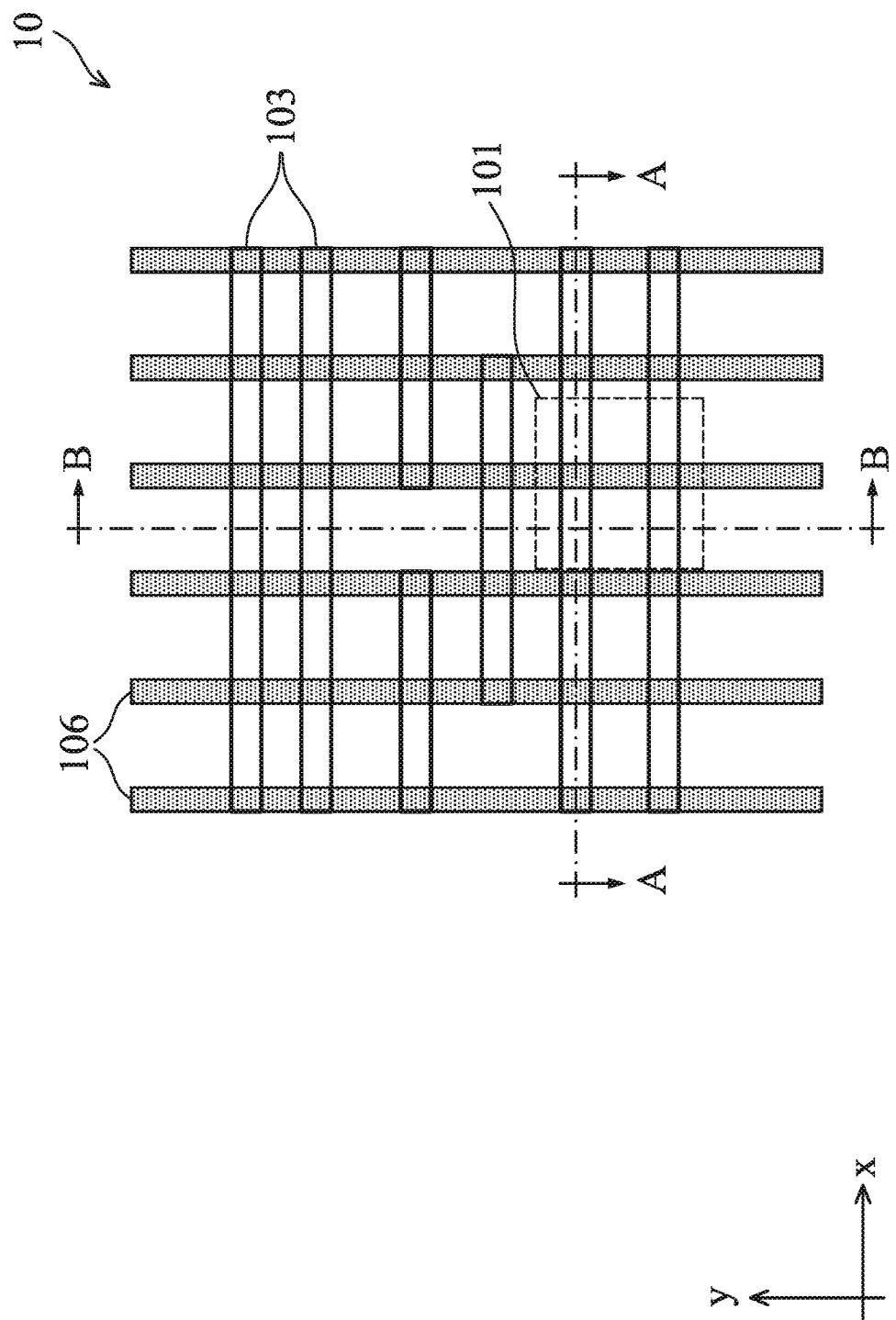
FIG. 2A shows a schematic top view of a semiconductor device (or structure), in portion, according to embodiments of the present disclosure.
Figure 2B:
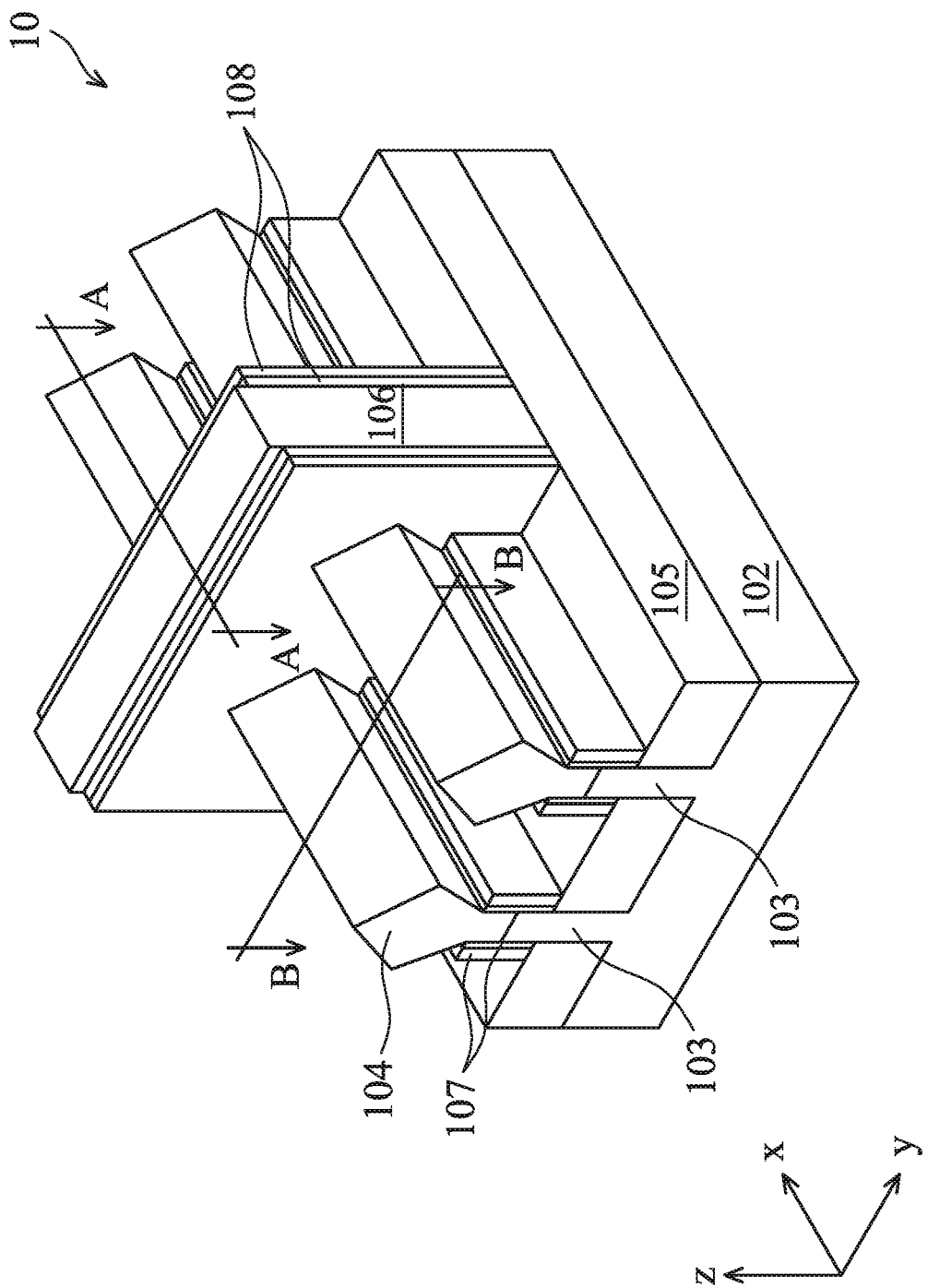
FIG. 2B shows a perspective view of a portion of the semiconductor device of FIG. 2A according to embodiments of the present disclosure.
Figure 2D:
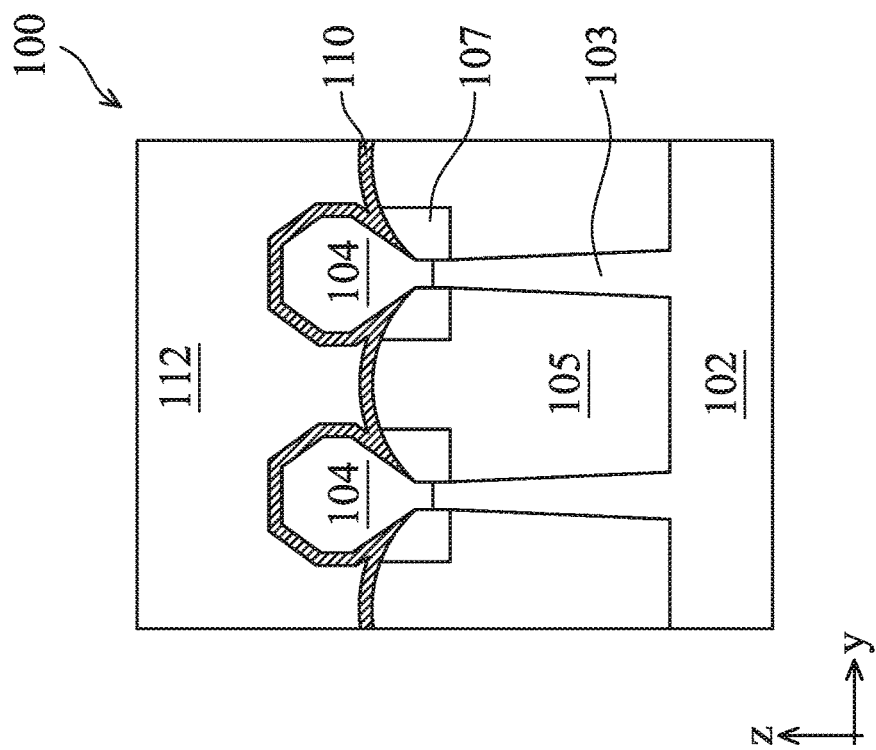
FIG. 2D shows a cross-sectional view of a portion of the semiconductor device of FIG. 2A along the B-B line of FIGS. 2A and 2B, according to embodiments of the present disclosure.
Figure 2C:
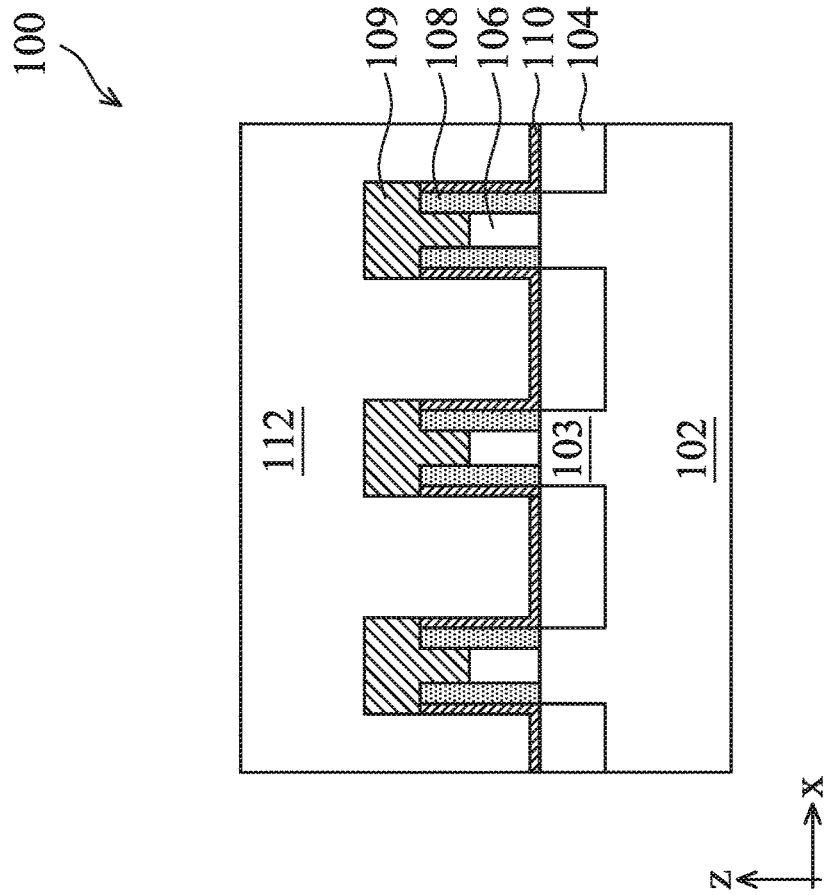
FIG. 2C shows a cross-sectional view of a portion of the semiconductor device of FIG. 2A along the A-A line of FIGS. 2A and 2B, according to embodiments of the present disclosure.

At operation 12, the method 10 (FIG. 1A) provides a structure of the device 100, an embodiment of which is shown in FIGS. 2A, 2B, 2C, and 2D. Particularly, FIG. 2A shows a schematic top view of a portion of the device 100, FIG. 2B shows a perspective view of a portion of the device 100; FIG. 2C shows a cross-sectional view of a portion of the device 100 along the A-A line of FIGS. 2A and 2B, and FIG. 2D shows a cross-sectional view of a portion of the device 100 along the B-B line of FIGS. 2A and 2B, according to embodiments of the present disclosure. Referring to FIG. 2A, the device 100 includes active regions (such as semiconductor fins) 103 oriented lengthwise along the "x" direction and gate stacks (or gate structures) 106 oriented lengthwise along the "y" direction that is generally perpendicular to the "x" direction. The gate stacks 106 engage the channel regions of the active regions 103 to form transistors therein, which may be FinFET or other types of multi-gate devices such as gate-all-around devices. FIG. 2B illustrates a portion 101 of the device 100 in an embodiment where the active regions 103 are semiconductor fins. Hereinafter the active regions 103 are also referred to as semiconductor fins 103 or fins 103.

Referring to FIGS. 2A-2D collectively, the device 100 includes a substrate 102, over which the fins 103 and the gate stacks 106 are formed. The device 100 includes an isolation structure 105 for isolating the fins 103. The fins 103 extend from the substrate 102 and above the isolation structure 105. The gate stacks 106 are disposed above the isolation structure 105 and on three sides of every fin 103. The device 100 further includes S/D features 104 over the fins 103 and on both sides of the gate stacks 106. The device 100 further includes gate spacers 108 on sidewalls of the gate stacks 106, fin sidewall spacers 107 on sidewalls of the fins 103, a contact etch stop layer (CESL) 110 over the gate spacers 108 and the S/D features 104, a dielectric gate cap 109 disposed on the gate stacks 106 (and optionally on the gate spacers 108 and/or the CESL 110), and a dielectric layer 112 over the dielectric gate cap 109 and the CESL 110 and filling in the gaps between the adjacent gate stacks 106. The various features (or components) of the device 100 are further described below.

The substrate 102 is a silicon (Si) substrate in the present embodiment, such as a silicon wafer. In alternative embodiments, the substrate 102 includes other elementary semiconductors such as germanium (Ge); a compound semiconductor such as silicon carbide (SiC), gallium arsenide (GaAs), indium arsenide (InAs), and indium phosphide (InP); or an alloy semiconductor, such as silicon germanium (SiGe), silicon germanium carbide (SiGeC), gallium arsenic phosphide (GaAsP), and gallium indium phosphide (GaInP). In embodiments, the substrate 102 may include silicon on insulator (SOI) substrate, be strained and/or stressed for performance enhancement, include epitaxial regions, doped regions, and/or include other suitable features and layers.

The fins 103 may include one or more layers of semiconductor materials such as silicon or silicon germanium. The fins 103 may be patterned by any suitable method. For example, the fins 103 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 103. For example, the masking element may be used for etching recesses into semiconductor layers over or in the substrate 102, leaving the fins 103 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 103 may be suitable. In some embodiment where the device 100 includes gate-all-around transistors, the fins 103 include multiple layers of semiconductor materials that are vertically stacked (along the "z" direction) and horizontally (along the "x" direction) connecting the S/D features 104 on opposing sides of the gate stack 106, and each of the multiple layers of semiconductor materials is surrounded by the gate stack 106.

The S/D features 104 may include epitaxial semiconductor materials with proper n-type or p-type dopants, for example, for applying proper stress and enhancing performance of the device 100. For example, the S/D features 104 may include silicon and may be doped with carbon, phosphorous, arsenic, other n-type dopant, or combinations thereof (for example, forming Si:C epitaxial source/drain features, Si:P epitaxial source/drain features, or Si:C:P epitaxial source/drain features). Alternatively, the S/D features 104 may include silicon germanium or germanium and may be doped with boron, other p-type dopant, or combinations thereof (for example, forming Si:Ge:B epitaxial source/drain features). The S/D features 104 may be formed by etching the fins 103 on both sides of the gate stacks 106 to form S/D trenches, and epitaxially growing semiconductor material(s) in the S/D trenches using CVD deposition techniques (for example, vapor phase epitaxy), molecular beam epitaxy, other suitable epitaxial growth processes, or combinations thereof. The S/D features 104 may be grown as a single-phase epitaxy or a multi-phase epitaxy or may include amorphous semiconductor material(s). The bottom surface of the S/D features 104 may be above the bottom surface of the fin sidewall spacers 107, such as shown in FIG. 2D. Alternatively, the bottom surface of the S/D features 104 may be below the bottom surface of the fin sidewall spacers 107. Adjacent S/D features 104 may be separated from each other or may merge together in some embodiments.

The isolation structure 105 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 105 is formed by etching trenches in or over the substrate 102 (e.g., as part of the process of forming the fins 103), filling the trenches with an insulating material, and performing a chemical mechanical planarization (CMP) process and/or an etching back process to the insulating material, leaving the remaining insulating material as the isolation structure 105. Other types of isolation structure may also be suitable, such as field oxide and LOCal Oxidation of Silicon (LOCOS). The isolation structure 105 may include a multi-layer structure, for example, having one or more liner layers (e.g., silicon nitride) on surfaces of the substrate 102 and the fins 103 and a main isolating layer (e.g., silicon dioxide) over the one or more liner layers.

Each of the gate stacks 106 includes a multi-layer structure. For example, each of the gate stacks 106 may include a dielectric interfacial layer, a high-k gate dielectric layer over the dielectric interfacial layer, and a gate electrode layer over the high-k gate dielectric layer. The gate electrode layer may include a work function layer and a metal fill layer over the work function layer. The gate stacks 106 may include additional layers such as capping layers and barrier layers. In various embodiments, the dielectric interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The high-k gate dielectric layer may include $HfO_2$, HfSiO, $HfSiO_4$, HfSiON, HfLaO, HfTaO, HfTiO, HfZrO, $HfAlO_x$, $ZrO_2$, $ZrSiO_2$, AlSiO, $Al_2O_3$, $TiO_2$, LaO, LaSiO, $Ta_2O_3$, $Ta_2O_5$, $Y_2O_3$, $SrTiO_3$, $BaZrO_3$, $BaTiO_3$ (BTO), (Ba,Sr) $TiO_3$ (BST), $Si_3N_4$, hafnium dioxide-alumina ($HfO_2$-$Al_2O_3$) alloy, other suitable high-k dielectric material, or combinations thereof. High-k dielectric material generally refers to dielectric materials having a high dielectric constant, for example, greater than that of silicon oxide (k≈3.9). The high-k gate dielectric layer may be formed by ALD and/or other suitable methods. The work function layer can be an n-type work function metal or a p-type work function metal. P-type work function layer includes any suitable p-type work function material, such as TiN, TaN, TaSN, Ru, Mo, Al, WN, WCN $ZrSi_2$, $MoSi_2$, $TaSi_2$, $NiSi_2$, other p-type work function material, or combinations thereof. N-type work function layer includes any suitable n-type work function material, such as Ti, Al, Ag, Mn, Zr, TiAl, TiAlC, TiAlSiC, TaC, TaCN, TaSiN, TaAl, TaAlC, TaSiAlC, TiAlN, other n-type work function material, or combinations thereof. The work function layer may be deposited by CVD, PVD, and/or other suitable process. The metal fill layer may include a metal such as aluminum (Al), tungsten (W), cobalt (Co), copper (Cu), and/or other suitable materials; and may be deposited using plating, CVD, PVD, or other suitable processes. The gate stacks 106 may be formed by any suitable processes including gate-first processes and gate-last processes. In a gate-first process, various material layers are deposited and patterned to become the gate stacks 106 before the S/D features 104 are formed. In a gate-last process (also termed as a gate replacement process), temporary gate structures are formed first. Then, after the S/D features 104 are formed, the temporary gate structures are removed and replaced with the gate stacks 106.

Each of the fin sidewall spacers 107 and the gate spacers 108 may be a single layer or multi-layer structure. In some embodiments, each of the spacers 107 and 108 include a dielectric material, such as silicon oxide ($SiO_2$), silicon nitride ($Si_3N_4$), silicon oxynitride (SiON), other dielectric material, or combination thereof. In an example, the spacers 107 and 108 are formed by depositing a first dielectric layer (e.g., a $SiO_2$ layer having a substantially uniform thickness) as an liner layer over the device 100 including the gate stacks 106 and the fins 103, and a second dielectric layer (e.g., a $Si_3N_4$ layer) as a main D-shaped spacer over the first dielectric layer, and then, anisotropically etching to remove portions of the dielectric layers to form the spacers 107 and 108. Additionally, the fin sidewall spacers 107 may be partially removed during the etching process that forms recesses into the fins 103 prior to growing the S/D features 104. In some embodiments, the fin sidewall spacers 107 may be completely removed by such etching process.

The CESL 110 may include silicon nitride ($Si_3N_4$), silicon oxynitride (SiON), silicon nitride with oxygen (O) or carbon (C) elements, and/or other materials. The CESL 110 may be formed by plasma enhanced CVD (PECVD) process and/or other suitable deposition or oxidation processes. The CESL 110 covers the outer surfaces of the S/D features 104, the sidewalls of the gate spacers 108, and the top surface of the isolation structure 105.

The dielectric gate cap 109 includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric gate cap 109 protects the gate stacks 106 from etching and CMP processes that are used for etching S/D contact holes. The dielectric gate cap 109 may be formed by recessing the gate stacks 106; depositing one or more dielectric materials over the recessed gate stacks 106, the gate spacers 108, and the CESL 110; and performing a CMP process to the one or more dielectric materials. In the embodiment depicted in FIG. 2C, the dielectric gate cap 109 includes a lower portion extending between two opposing sidewalls of the gate spacer 108. This lower portion has a width w1 ranging from 2 nm to 50 nm and a height h1 ranging from 1 nm to 50 nm in an embodiment. The dielectric gate cap 109 further includes an upper portion above the gate spacer 108 and the CESL 110. This upper portion may have a height h2 ranging from 1 nm to 30 nm in an embodiment. In some embodiment (not shown), the dielectric gate cap 109 has the lower portion but not the upper portion. In other words, the dielectric gate cap 109 is disposed between the two opposing sidewalls of the gate spacer 108 but not above the gate spacer 108. In some embodiment (not shown), the dielectric gate cap 109 has the upper portion but not the lower portion. In other words, the dielectric gate cap 109 is disposed above the gate stack 106, the gate spacer 108, and the CESL 110, but not disposed between the two opposing sidewalls of the gate spacer 108.

The dielectric layer 112 (also referred to as inter-level dielectric, interlayer dielectric, or ILD layer 112) may include materials such as tetraethylorthosilicate (TEOS) oxide, un-doped silicate glass, or doped silicon oxide such as borophosphosilicate glass (BPSG), fluoride-doped silica glass (FSG), phosphosilicate glass (PSG), boron doped silicon glass (BSG), and/or other suitable dielectric materials. The ILD layer 112 may be deposited by a PECVD process, a flowable CVD (FCVD) process, or other suitable deposition technique. In an embodiment, the CESL 110 is deposited as a conformal layer over the substrate 102 covering various structures thereon, and the ILD layer 112 is deposited over the CESL 110 to fill trenches between the gate stacks 106. Then, the ILD layer 112 and the CESL 110 are partially removed during a process of forming the gate stacks 106 (e.g., a replacement gate process) and the gate dielectric cap 109. Thereafter, additional dielectric materials are deposited over the gate stacks 106 (e.g., a replacement gate process) and the gate dielectric cap 109. These additional dielectric materials become part of the ILD layer 112.

At operation 14, the method 10 (FIG. 1A) etches the ILD layer 112 and the CESL 110 to form contact holes (or holes) 116. Referring to FIGS. 3A and 3B, the contact holes 116 expose portions of the S/D features 104. The operation 14 may involve a variety of processes including deposition, photolithography, and etching. For example, an etch mask (not shown) may be formed over the device 100, providing openings, through which various portions of the device 100 are exposed. The openings correspond to the areas of the device 100 where S/D contacts for S/D features 104 are to be formed. In various embodiments, the etch mask may include a hard mask layer (e.g., having silicon nitride or silicon oxide), a photoresist layer, or a combination thereof. The etch mask may be formed by deposition, photolithography, and etching processes. Then, the device 100 is etched through the openings in the etch mask to remove portions of the dielectric layer 112, for example, using a dry etching process, a wet etching process, a reactive ion etching process, or other suitable etching processes to form the holes 116. The etching process is tuned selective to the material of the dielectric layer 112, and with no (or minimal) etching to the dielectric gate cap 109 and the CESL 110. Subsequently, another etching process is performed through the openings in the etch mask to remove portions of the CESL 110 at the bottom of the holes 116, for example, using a dry etching process, a wet etching process, or a reactive ion etching process. Particularly, this etching process is anisotropic and is tuned selective to the CESL 110. As a result, portions of the CESL 110 remain over the side surfaces of the gate spacers 108 after the etching process is finished. In various embodiments, the ILD layer 112 and the CESL 110 may be etched by one joint etching process or by more than one etching process. Following the etching process, the etch mask is removed, for example, by stripping or etching. At the end of the operation 14, the contact holes 116 are formed. Each of the contact holes 116 exposes portions of the S/D feature 104, some side surfaces of the ILD layer 112, top and side surfaces of the dielectric gate cap 109, and side surfaces of the CESL 110.

Figure 4B:
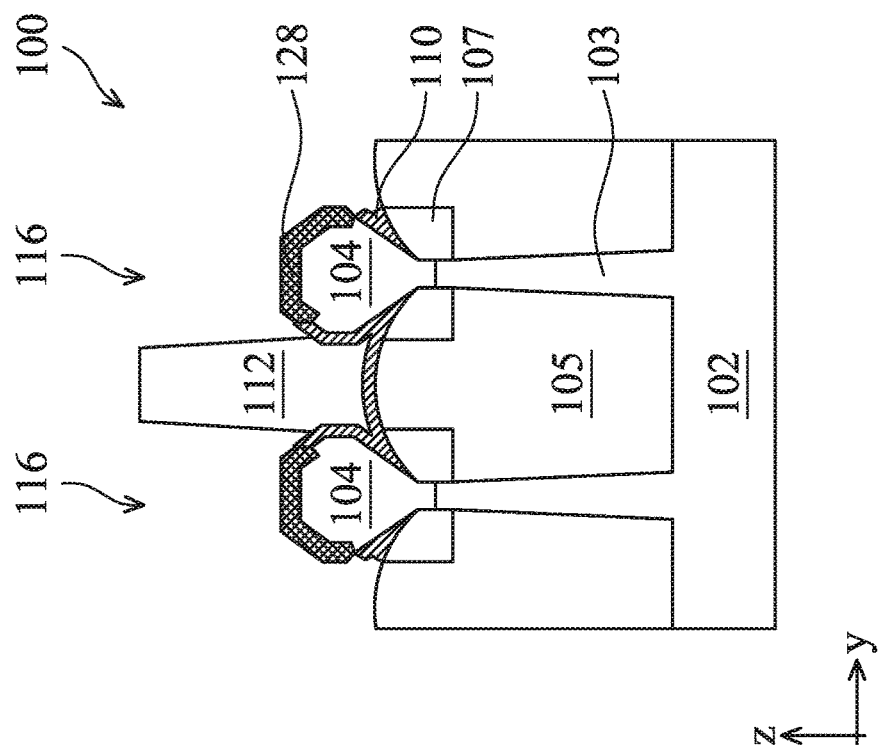
Figure 4A:
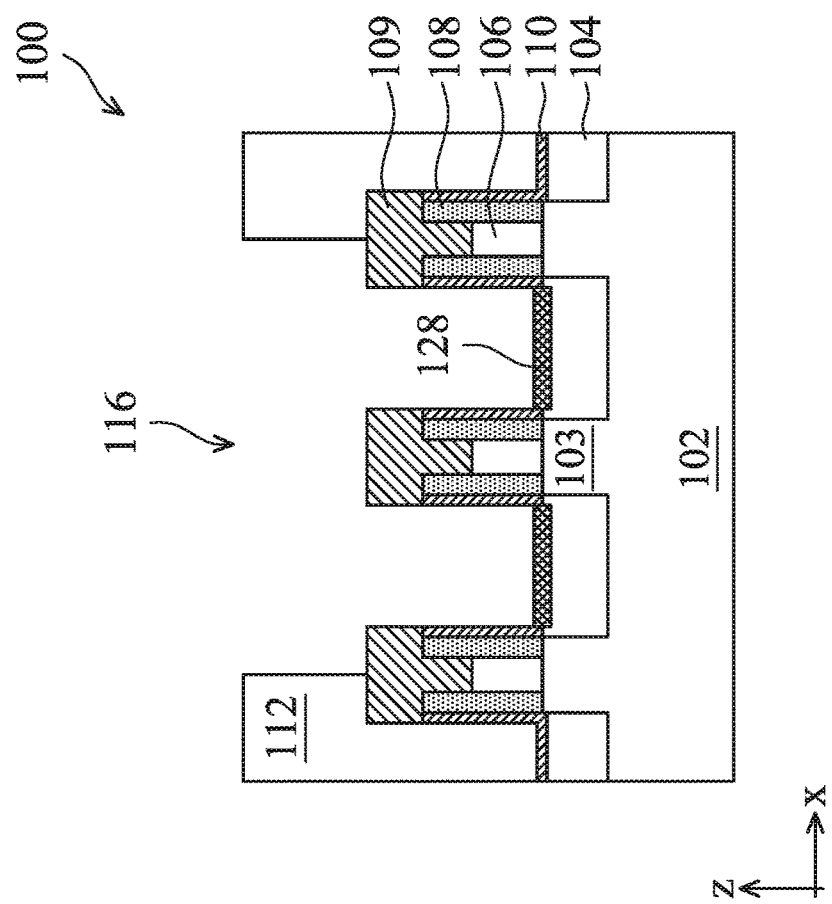

At operation 16, the method 10 (FIG. 1A) forms silicide features 128 over the exposed portions of the S/D features 104. Referring to FIGS. 4A and 4B, the silicide features 128 are formed on one or more surfaces of the S/D features 104. The edge area (or end area) of the silicide features 128 are adjacent to the CESL 110. In an embodiment, the operation 16 includes depositing one or more metals into the contact holes 116, performing an annealing process to the device 100 to cause reaction between the one or more metals and the S/D features 104 to produce the silicide features 128, and removing un-reacted portions of the one or more metals, leaving the silicide features 128 exposed in the contact holes 116. The one or more metals may include titanium (Ti), tantalum (Ta), tungsten (W), nickel (Ni), platinum (Pt), ytterbium (Yb), iridium (Ir), erbium (Er), cobalt (Co), or a combination thereof (e.g., an alloy of two or more metals) and may be deposited using CVD. PVD. ALD, or other suitable methods. The silicide features 128 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds.

Figures 12, 13:
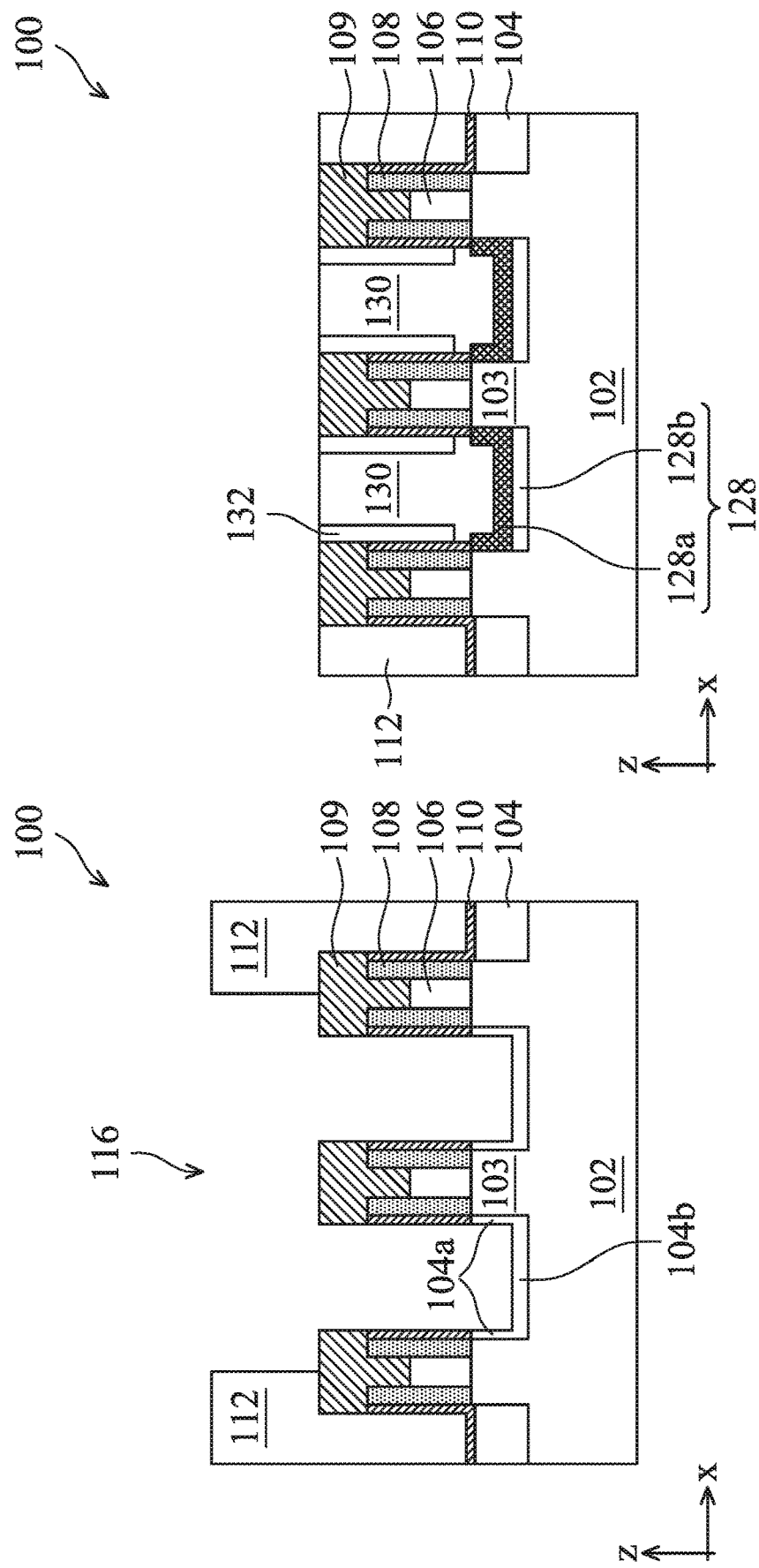
FIGS. 12 and 13 illustrate cross-sectional views of a portion of a semiconductor device along the A-A line of FIGS. 2A and 2B during various manufacturing stages according to the method in FIGS. 1A and 1B in accordance with an alternative embodiment of the present disclosure.

In some embodiments, the S/D features 104 may be over-etched before forming the silicide features 128, an example of which is shown in FIG. 12. Referring to FIG. 12, the S/D features 104 are etched (e.g., as part of the operation 14) and their exposed top surfaces become a U-shape in this cross-sectional view. Particularly, each of the exposed S/D features 104 has two sidewall S/D sections 104a directly under the CESL 110 and a main S/D section 104b below the two sidewall S/D sections 104a. To further these embodiments, the silicide features 128 may also have a U-shaped top surface, such as shown in FIG. 13. Referring to FIG. 13, each of the silicide features 128 has two sidewall silicide sections 128a above a main silicide section 128b. In various embodiments, a width of the sidewall S/D sections 104a (along the "x" direction) may be in the range of about 0.1 nm to 10 nm after the operation 16. Alternatively, the sidewall S/D sections 104a may be fully converted to the silicide features 128 during the silicidation process. In some embodiments, the sidewall silicide sections 128a may have a width of about 1 nm to 10 nm and may extend above the main silicide section 128b by about 0.1 nm to 10 nm. Further, the main silicide section 128b may have a thickness (e.g., along the "z" direction) of about 1 nm to 10 nm.

Figures 5A, 5B:
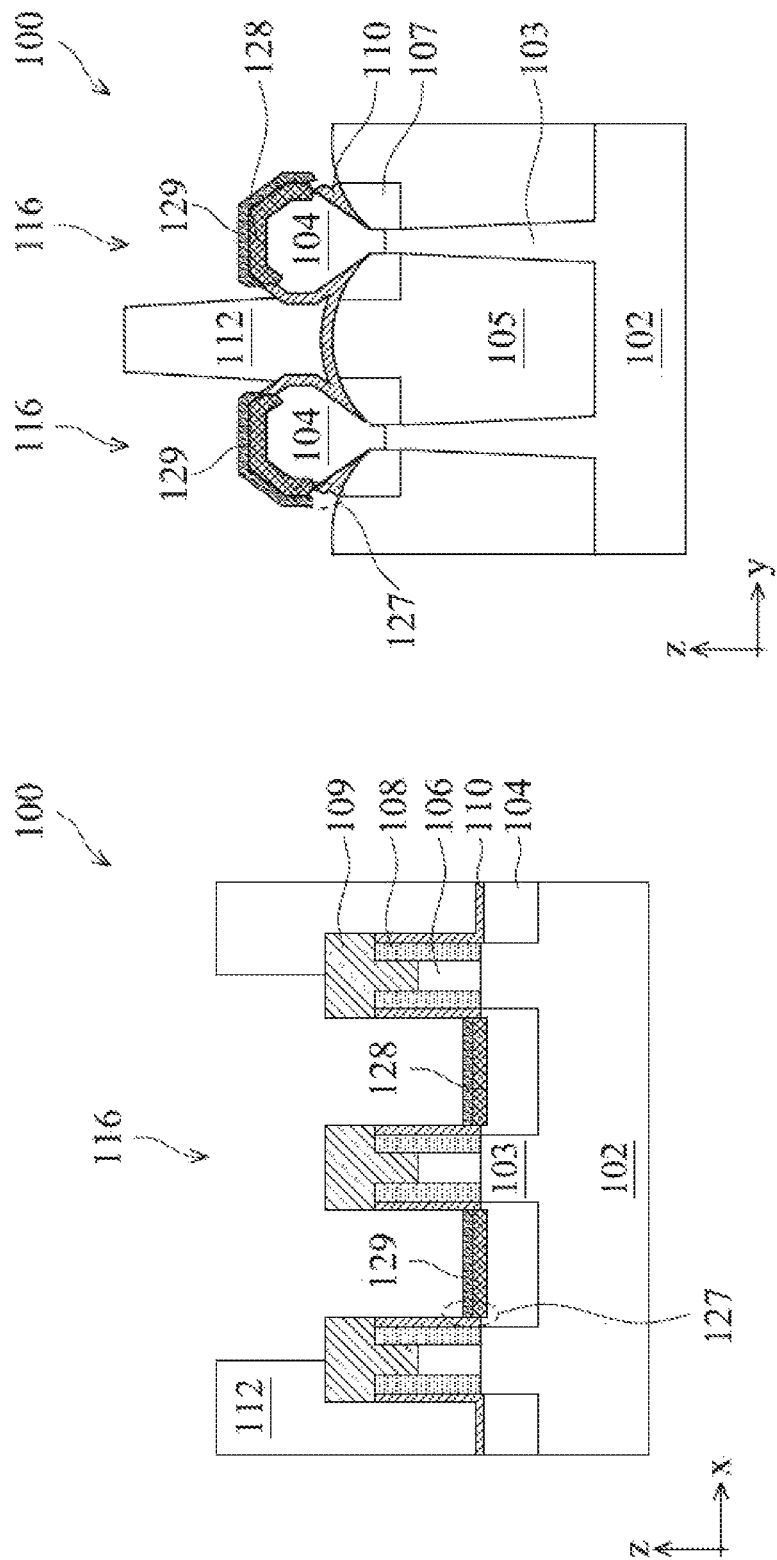

At operation 18, the method 10 (FIG. 1A) selectively deposits an inhibitor 129 on the device 100. The inhibitor 129 includes an organic or organic-like film that includes amphiphilic or amphiphilic-like molecules. Referring to FIGS. 5A and 5B, the inhibitor 129 is deposited on the surfaces of the silicide features 128, but not on the dielectric layers 112, 109, and 110. It is noted that the inhibitor 129 may or may not touch the CESL 110 in a corner area 127 where the silicide feature 128 and the CESL 110 meet. In an embodiment, the inhibitor 129 is deposited on the surface of the silicide features 128 due to covalent bonds between the molecules of the silicide features 128 and the molecules of the inhibitor 129. Such covalent bonds do not exist between the dielectric surfaces of the layers 112, 109, 110 and the inhibitor 129. Thus, the inhibitor 129 is not deposited over these dielectric surfaces. The inhibitor 129 further has a hydrophobic property such that it is not attachable to a dielectric material (i.e., it repels the deposition of a dielectric material thereon), which will be further explained with reference to the operation 20. For example, the inhibitor 129 may include a compound of alkyl chain or carboxylic acid in some embodiment or may have a chemical formula of $SHCH_2C_6H_4CH_2SH$, or $HS-(CH_2)_n-COOH$ in some embodiment. The inhibitor 129 may be deposited using ALD, PVD. CVD, or other suitable methods and may have a thickness (along the "z" direction) of about 1 nm to 30 nm. The thickness of the inhibitor 129 determines the size of a gap between the silicide features 128 and a dielectric liner layer (such as the dielectric liner layer 132) to be formed in a later step. As will be discussed later, the gap is filled with S/D contact feature(s) (such as the S/D contacts 130) to be formed in a later step. If the inhibitor 129 is too thin (such as less than 1 nm), then the gap would be too small to be filled by the S/D contact feature(s) in some instances. This would inadvertently reduce the S/D contact area. If the inhibitor 129 is too thick (such as more than 30 nm), then the risk of shorting the S/D contact feature(s) to nearby gates or S/D contact features would increase in some instances. Therefore, the thickness of the inhibitor 129 is controlled to be in the range of about 1 nm to about 30 nm in the present embodiment. In the present embodiment, the inhibitor 129 is deposited only on selected surfaces (i.e., the surfaces of the silicide feature 128) without involving a photolithography process. Thus, the operation 18 is a selective deposition process.

Figure 6B:
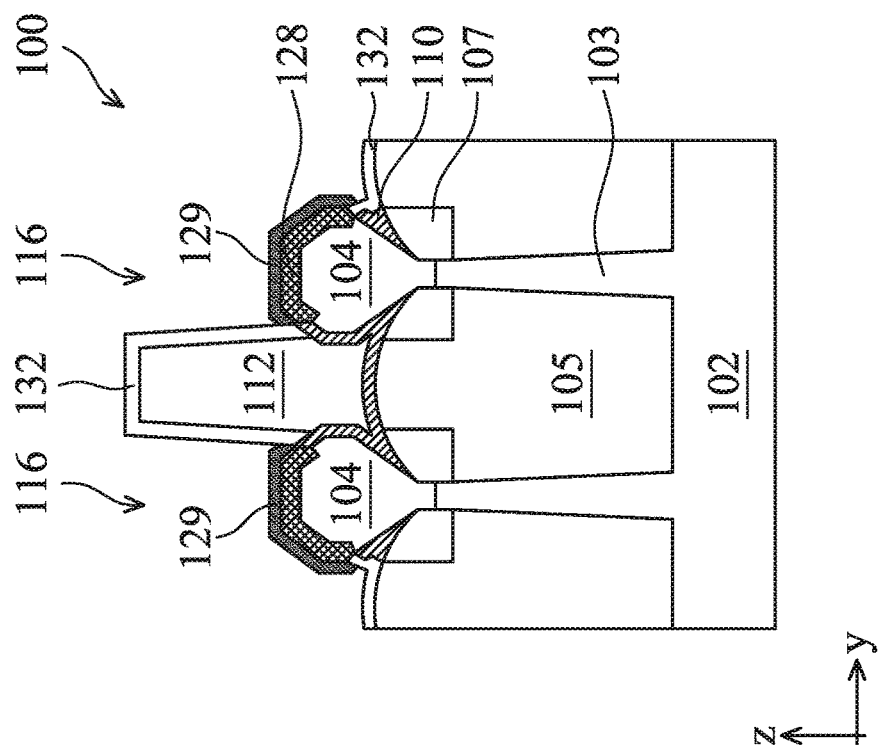
Figure 6A:
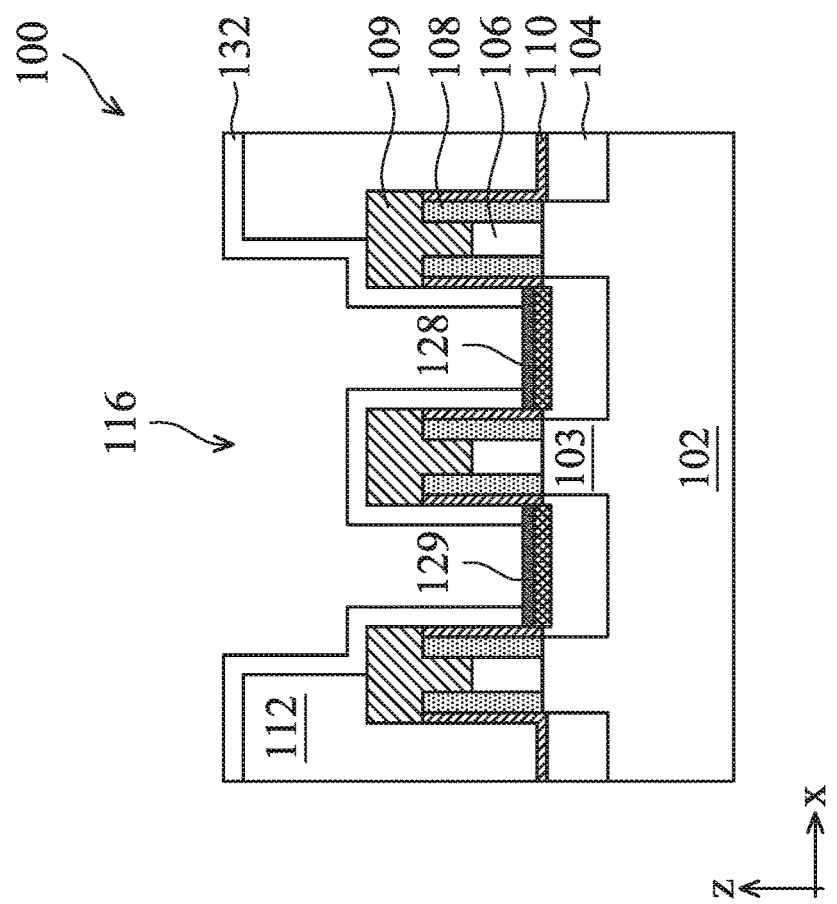

At operation 20, the method 10 (FIG. 1A) selectively deposits a dielectric liner layer 132 on bottom and sidewalls of the contact holes 116 and on the top surface of the ILD layer 112. Referring to FIGS. 6A and 6B, the dielectric liner layer 132 is deposited to have a substantially uniform thickness along the various surfaces of the ILD layer 112, the isolation feature 105, the dielectric gate cap 109, and the CESL 110. Due to the hydrophobic property of the inhibitor 129, the dielectric liner layer 132 is not deposited on the inhibitor 129 except some edge areas of the inhibitor 129. The dielectric liner layer 132 may or may not touch the edge areas of the inhibitor 129. In various embodiment, the dielectric liner layer 132 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN. ZrSi, or other suitable material(s). The dielectric liner layer 132 functions to isolate the adjacent S/D contacts that are to be formed in the contact holes 116 (FIG. 6B). Without the dielectric liner layer 132, metals from the S/D contacts may diffuse into the ILD layer 112 over time to short the S/D contacts, causing circuit failure. The dielectric liner layer 132 also functions to isolation the S/D contacts from the nearby gate stacks 106. The dielectric liner layer 132 may be deposited using ALD, CVD, or other suitable methods, and may have a thickness of about 1 nm to about 30 nm (e.g., as measured on the sidewalls of the CESL 110 along the "x" direction) in various embodiments. In the present embodiment, the dielectric liner layer 132 is deposited only on selected surfaces (i.e., the surfaces of the ILD layer 112, the isolation feature 105, the dielectric gate cap 109, and the CESL 110) without involving a photolithography process. Thus, the operation 20 is a selective deposition process. Particularly, since the dielectric liner layer 132 is not deposited on the inhibitor 129, a vertical etching process for breaking down the dielectric liner layer 132 is not needed.

At operation 22, the method 10 (FIG. 1A) removes the inhibitor 129 from the device 100, particularly from the surfaces of the silicide features 128. Referring to FIGS. 7A and 7B, the removal of the inhibitor 129 results in gaps (or voids) 133 in the corner areas 127 where the silicide features 128 and the CESL 110 meet. In the cross-sectional view of FIG. 7A, the gaps 133 exist directly below the dielectric liner layer 132 and above the silicide feature 128 and expose a portion of the side surface of the CESL 110. Similarly, in the cross-sectional view of FIG. 7B, the gaps 133 exposes the surfaces of the silicide feature 128, the dielectric liner layer 132, and the CESL 110. In an embodiment, the removal of the inhibitor 129 includes a plasma dry etching process, a chemical dry etching process, an ashing process, a wet etching process, or a combination thereof. The etching and ashing processes are selective to the materials of the inhibitor 129 and have no (or minimal) etching to the dielectric liner layer 132, the CESL 110, and the silicide features 128. For example, the plasma dry etching process may use conventional dry etchant for dielectric material such as $C_4F_6$ mixed with $H_2$ or $O_2$, the chemical dry etching process may use one or more chemicals such as $H_2$, the ashing process may use oxygen or hydrogen ashing, and the wet etching process may apply a hot SPM solution (a mixture of sulfuric acid and hydrogen peroxide), for example, at a temperate above 100° C.

As a result of the operations 18, 20, and 22, various surfaces of the silicide feature 128 are exposed in each contact hole 116 and the dielectric liner layer 132 is disposed over various surfaces of the ILD layer 112, the isolation feature 105, the dielectric gate cap 109, and the CESL 110. In approaches that do not use the inhibitor 129 (i.e., omitting the operation 18 and 22), the dielectric liner layer 132 would be deposited not only on the surfaces of the layers 112, 109, and 110, but also on the silicide features 128. In order to expose the silicide features 128 for subsequent electrical connection to S/D contacts, an etching process would be performed to etch the dielectric liner layer 132. Sometimes, to ensure that the dielectric liner layer 132 is completely removed from the surfaces of the silicide features 128, an over-etching would be performed. The over-etching may lead to unnecessary loss of the silicide features 128 and/or the S/D features 104. Further, these etching processes sometimes also partially or completely remove the dielectric gate cap 109. To compensate for the loss of the dielectric gate cap 109, these approaches would make an initial gate stack (e.g., dummy gates) tall, which inadvertently decreases the robustness of the process because tall and narrow stacks may collapse during fabrication. In contrast, by using the inhibitor 129, processes according to the present embodiment are more robust and have better control on the volume of the S/D features 104. Further, due to the presence of the gaps 133, there are more areas of the silicide features 128 for making S/D contacts, thereby reducing S/D contact resistance.

At operation 24, the method 10 (FIG. 1B) deposits one or more metals or metallic materials 130 into the contact holes 116 and filling the contact holes 116. Referring to FIGS. 8A and 8B, the one or more metals 130 are deposited over the top and side surfaces of the S/D features 104 and in direct contact with the silicide feature 128. Particularly, the one or more metals 130 fill the gaps 133. In other words, a portion of the one or more metals 130 is in direct contact with a surface of the dielectric liner layer 132, a surface of the CESL 110, and a surface of the silicide feature 128. In embodiments, the one or more metals 130 may include tungsten (W), cobalt (Co), copper (Cu), Ruthenium (Ru), other metals, metal nitrides such as titanium nitride (TiN), titanium aluminum nitride (TiAlN), tungsten nitride (WN), tantalum nitride (TaN), or combinations thereof, and may be formed by CVD, PVD, plating, and/or other suitable processes. In some embodiments, the one or more metals 130 include a layer of metal nitride (e.g., TiN, TiAlN, WN, or TaN) and a layer of metal (e.g., W, Co, or Cu) over the layer of the metal nitride. To further these embodiments, the layer of metal nitride makes direct contact with the surfaces of the dielectric liner layer 132, the CESL 110, and the silicide feature 128 in the gaps 133. Further, because the one or more metals 130 fill the gaps 133, the interfacial area between the one or more metals 130 and the silicide feature 128 is increased, compared to approaches where the gaps 133 do not exist and the dielectric liner layer 132 directly contacts the silicide feature 128. The increased interfacial area reduces the S/D contact resistance.

Figure 9B:
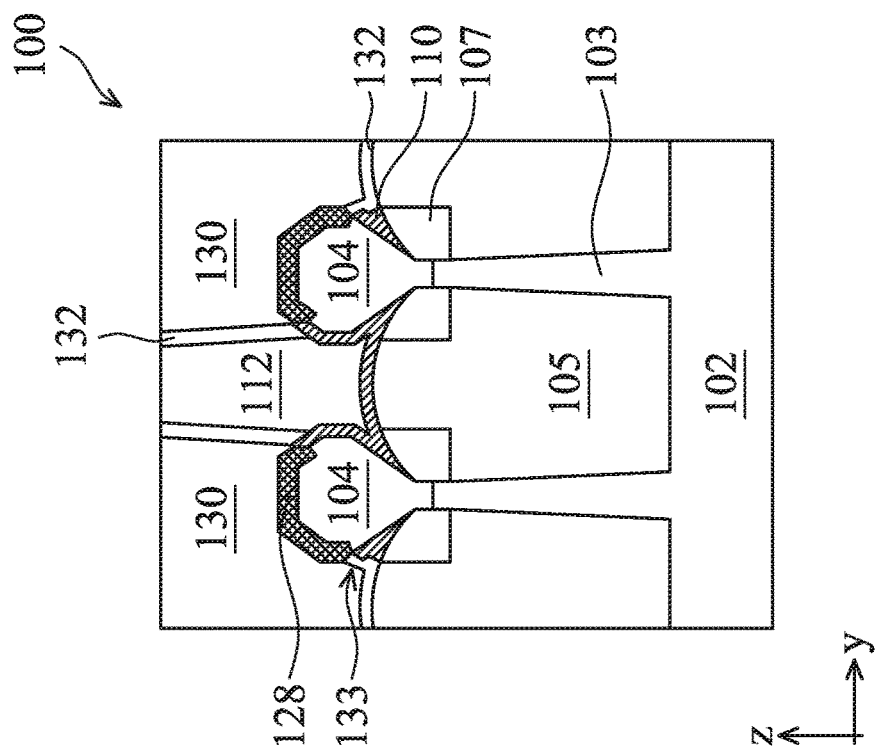
Figure 9A:
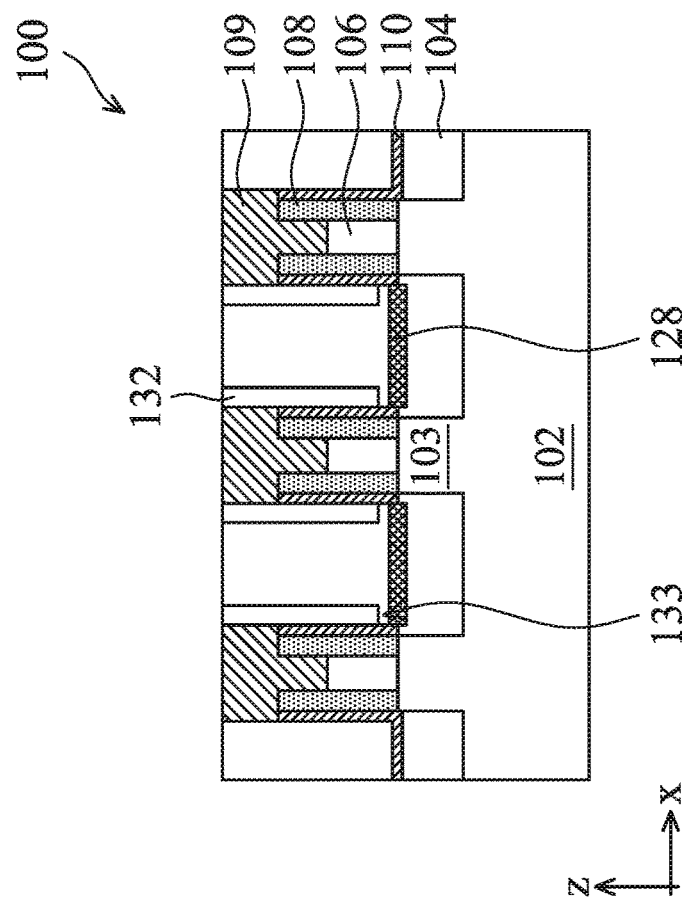

At operation 26, the method 10 (FIG. 1B) performs a CMP process to planarize a top surface of the device 100. Referring to FIGS. 9A and 9B, in the present embodiment, the CMP process removes excessive portions of the one or more metals 130, the dielectric liner layer 132, and the ILD layer 112, and stops at the dielectric gate cap 109. The CMP process may also partially remove the dielectric gate cap 109 in some embodiments. The remaining portion of the one or more metals becomes the S/D contacts 130.

Figure 10B:
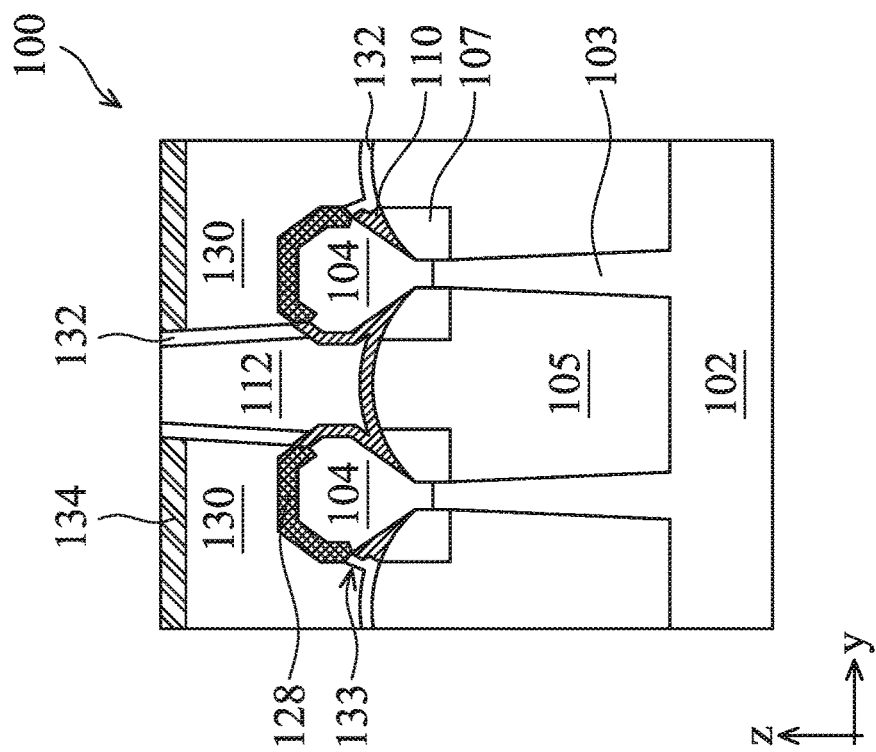
Figure 10A:
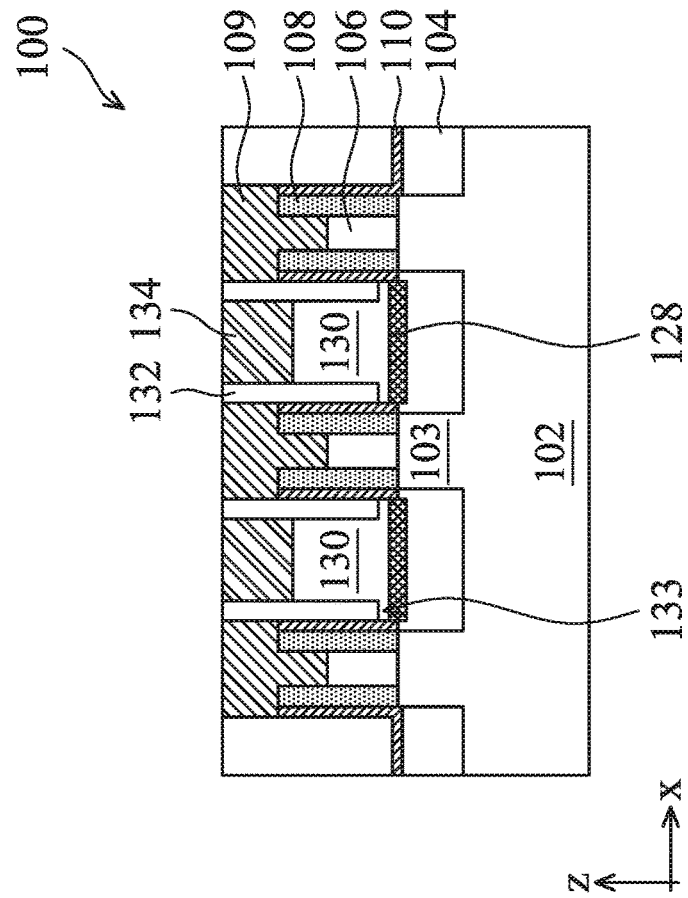

At operation 28, the method 10 (FIG. 1B) recesses the S/D contacts 130 and forms a dielectric S/D cap 134 in the recess. Referring to FIGS. 10A and 10B, the S/D contacts 130 are recessed by one or more etching processes to form a recess (not shown) between two opposing portions of the dielectric liner layer 132. The one or more etching processes may include a dry etching, a wet etching, a reactive ion etching, or a combination thereof. Further, the one or more etching processes are tuned to selectively etch the materials of the S/D contacts 130 and have no (or minimal) etching to the ILD layer 112, the dielectric gate cap 109, and the dielectric liner layer 132. After the recess is formed, one or more dielectric materials are deposited into the recess, which may be followed by a CMP process to planarize the top surface of the device 100. The one or more dielectric materials remaining in the recess become the dielectric S/D cap 134. In various embodiment, the dielectric S/D cap 134 may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s). The dielectric S/D cap 134 may be deposited using ALD, CVD, or other suitable methods, and may have a thickness of about 2 nm to about 30 nm (e.g., as measured along the "z" direction) in various embodiments. In some embodiments of the method 10, the operation 28 is omitted and the dielectric S/D cap 134 is also omitted in the device 100.

The method 10 may perform further steps at the operation 30 to complete the fabrication of the device 100. For example, it may perform various processes to form gate contacts electrically coupled to the gate stacks 106 and form metal interconnects connecting the S/D contacts 130 to other portions of the device 100 to form a complete IC. Further, although the embodiments shown in FIGS. 2A-10B include fins 103 (therefore applicable to FinFETs), the present disclosure is not so limited, and the disclosed techniques can be applied to planar transistors or other types of multi-gate transistors for reducing S/D contact resistance and improving S/D contact isolation in those transistors.

Figure 11A:
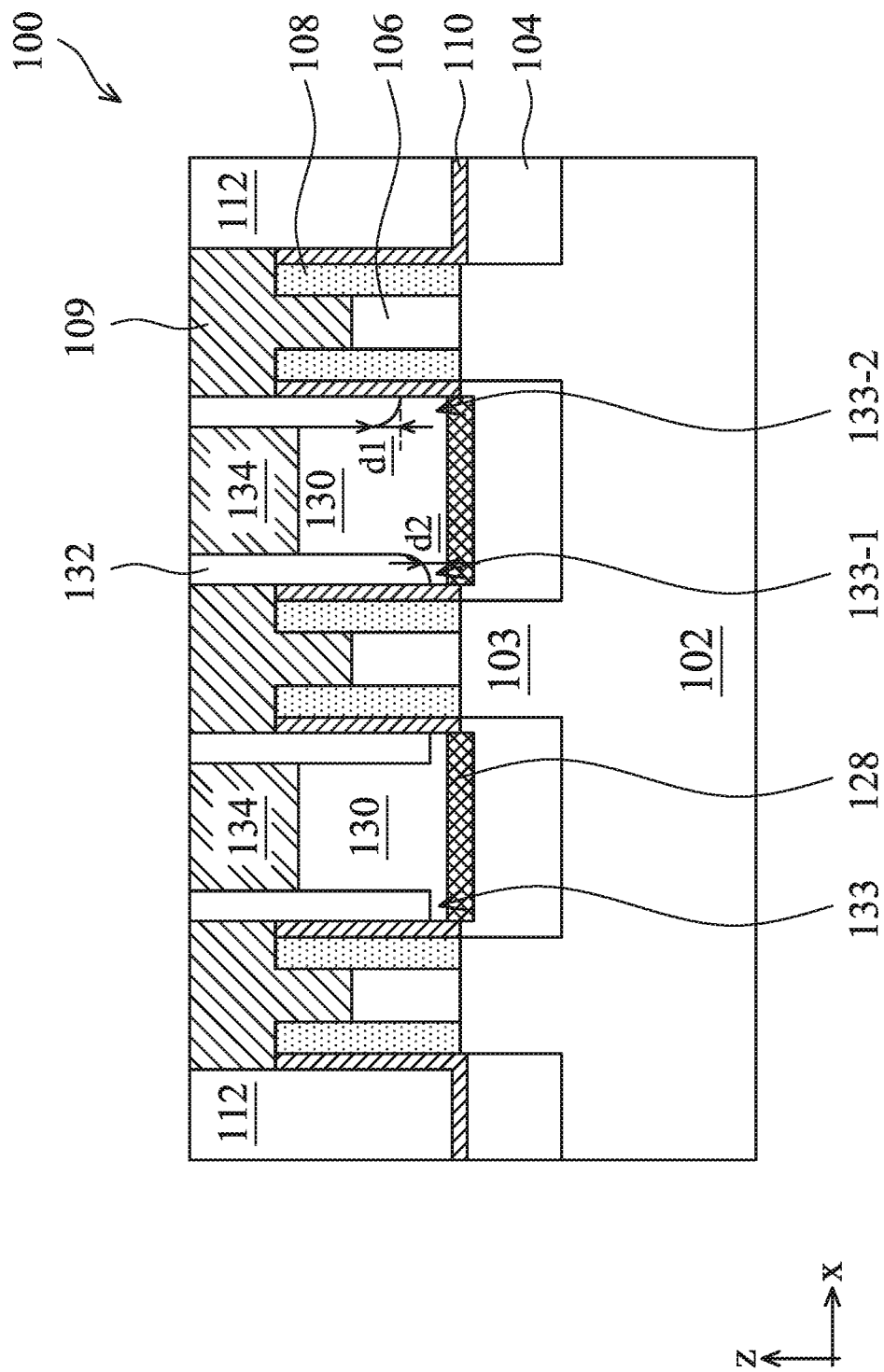
Figure 11B:
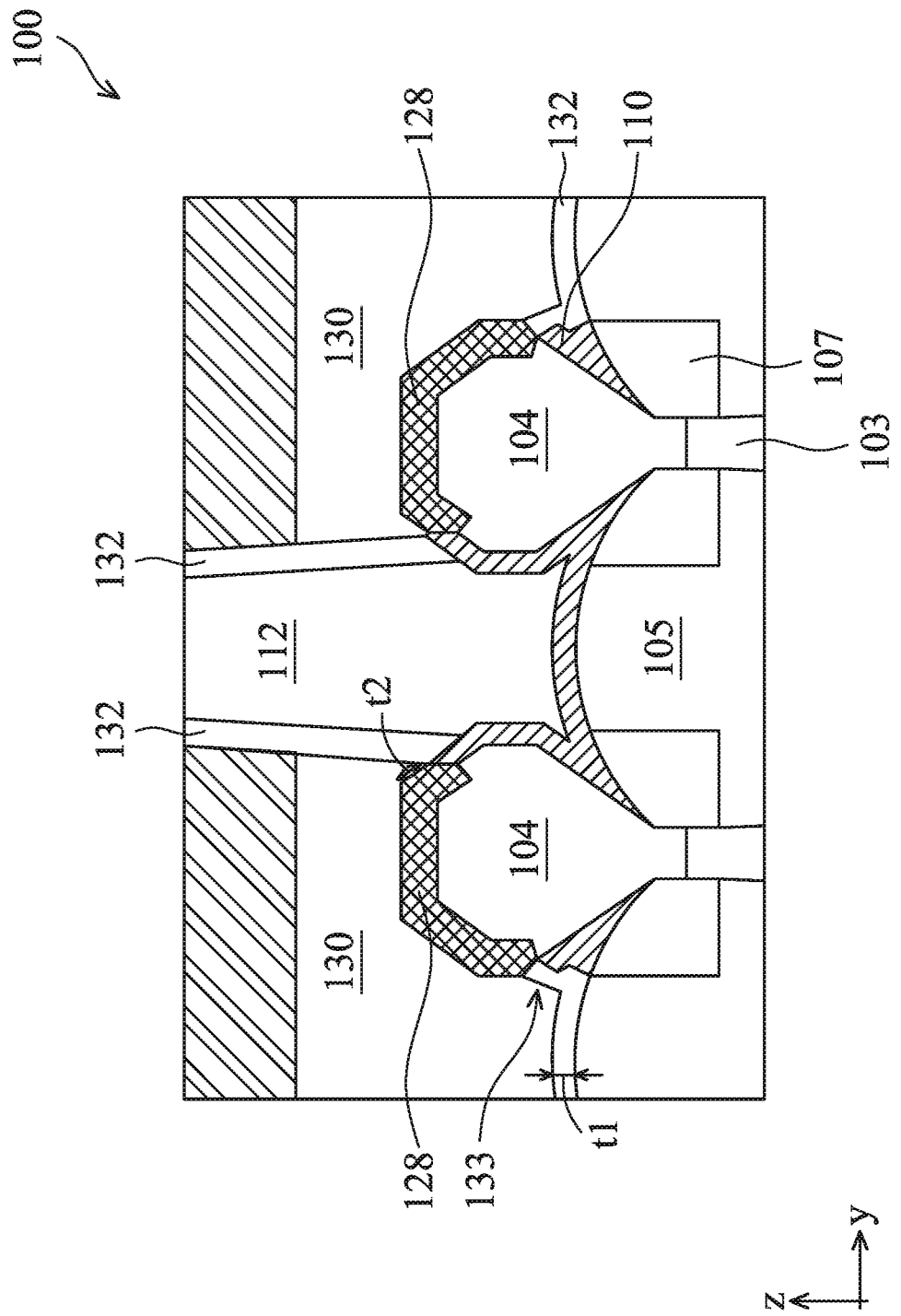

FIGS. 11A and 11B illustrate some embodiment of the device 100 fabricated according to an embodiment of the method 10. For simplicity, the same reference numerals indicate the same features between the embodiment in FIGS. 10A-10B and the embodiment in FIGS. 11A-11B. FIG. 11A further illustrates two variants of the gap 133-gap 133-1 and gap 133-2 that are surrounded at three sides by the dielectric liner layer 132, the CESL 110, and the silicide feature 128 and are open towards the center of the S/D contact 130. In FIGS. 11A and 11B, the gaps 133, 133-1, and 133-2 are filled by the S/D contacts 130. As illustrated, each of the two gaps 133-1 and 133-2 becomes narrower as it approaches the side surface of the CESL 110 (i.e., each of them is wider towards the center of the S/D contacts 130 and is narrower towards the CESL 110). This may have resulted from the property of the materials in the inhibitor 129 and the dielectric liner layer 132 in the operations 18-20 of FIG. 1A. This may have alternatively or additionally resulted from the etching process that removes the inhibitor 129 in the operation 22 of FIG. 1A. The bottom surface of the dielectric liner layer 132 have a rounded profile directly above the gaps 133-1 and 133-2. In some embodiments, the rounding d1 of the bottom surface of the dielectric liner layer 132 (i.e. the vertical distance between the highest point of the bottom surface to the lowest point of the bottom surface of the dielectric liner layer 132) is in a range of about 1 nm to 30 nm. The rounded profile makes it easier for the S/D contacts 130 to fill into the gaps. In various embodiments, a distance d2 between the bottom surface of the dielectric liner layer 132 and the top surface of the silicide feature 128 is in a range of about 1 nm to 30 nm. The distance d2 is the height of the gaps 133 (including 133-1 and 133-2). If the distance d2 is smaller than 1 nm, it will become more difficult for the S/D contacts 130 to fill in the gap, reducing the interfacial area between the S/D contact 130 and the silicide feature 128 and increasing S/D contact resistance. If the distance d2 is greater than 30 nm, then there may be areas on the ILD layer 112 that are not sufficiently covered by the dielectric liner 132 (for example, in the view shown in FIG. 11B), leading to metal diffusion from the S/D contacts 130 into the ILD layer 112. Therefore, having the distance d2 in the range of 1 nm to 30 nm achieves a good balance between reducing S/D contact resistance and improving S/D contact isolation. Further, the two gaps 133-1 and 133-2 may have the same distance d2 or they may have different distances d2 (i.e., their height may have the same or different values). Referring to FIG. 11B, the portion of the dielectric liner layer 132 on the top surface of the isolation feature 105 has a thickness t1 of about 1 nm to 30 nm. In approaches that do not utilize the inhibitor 129, this portion of the dielectric liner layer 132 generally does not exist (or is removed before depositing the metals for the S/D contacts 130). Having this portion of the dielectric liner layer 132 increases the isolation between the S/D contacts 130 and the isolation feature 105. Further, the portion of the dielectric liner layer 132 on the sidewalls of the contact hole (or on the sidewalls of the ILD layer 112 facing the contact hole) may overlap with the silicide feature 128 by a thickness t2 along the sloped surface of the silicide feature 128. In various embodiments, the thickness t2 is in a range of about-10 nm (i.e., the dielectric liner layer 132 and the silicide feature 128 have no overlap and are spaced away by up to 10 nm along the sloped surface of the silicide feature 128) to 10 nm (i.e., the dielectric liner layer 132 and the silicide feature 128 have an overlap up to 10 nm along the sloped surface of the silicide feature 128).

Although not intended to be limiting, one or more embodiments of the present disclosure provide many benefits to a semiconductor device and a formation process thereof. For example, embodiments of the present disclosure provide a process for depositing a dielectric liner layer on sidewalls of a contact hole but not on the bottom of the contact hole. This is achieved by depositing a dielectric-inhibitor on the bottom of the contact hole prior to the deposition of the dielectric liner layer and removing the dielectric-inhibitor after the deposition of the dielectric liner layer. This process avoids vertical etching of the dielectric liner layer and increases process robustness while achieving good S/D contact isolation and reducing S/D contact resistance. Further, the provided subject matter can be readily integrated into existing IC fabrication flow and can be applied to many different process nodes.

In one example aspect, the present disclosure is directed to a method. The method includes providing a structure that includes a substrate; a gate structure over the substrate; a gate spacer on a sidewall of the gate structure; a dielectric gate cap over a top surface of the gate structure; a source/drain (S/D) feature over the substrate and adjacent to the gate structure; a contact etch stop layer (CESL) covering a sidewall of the gate spacer and a top surface of the S/D feature; and an inter-level dielectric (ILD) layer over the dielectric gate cap, the gate spacer, the CESL, and the S/D feature. The method further includes etching a contact hole through the ILD layer and through a portion of the CESL that is disposed over the S/D feature, wherein the contact hole exposes the CESL covering the sidewalls of the gate spacer and exposes a top portion of the S/D feature. The method further includes forming a silicide feature on the top portion of the S/D feature and selectively depositing an inhibitor on the silicide feature, wherein the inhibitor is not deposited on surfaces of the CESL other than at a corner area where the CESL and the silicide feature meet.

In an embodiment of the method, the inhibitor includes an organic film having amphiphilic molecules. In an embodiment, the method further includes selectively depositing a dielectric liner layer covering a sidewall of the CESL, wherein the dielectric liner layer is not deposited on the inhibitor other than an edge area of the inhibitor. In a further embodiment, the dielectric liner layer includes at least one of $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi. In another further embodiment, the method includes removing the inhibitor; depositing one or more metallic materials into the contact hole; and performing a chemical-mechanical planarization process to the one or more metallic materials. In some embodiments, the removing of the inhibitor includes plasma dry etching, chemical dry etching, ashing, wet etching, or a combination thereof. In some alternative embodiments, the removing of the inhibitor includes a wet etching with SPM cleaning solution at a temperature over 100° C. In some embodiments, the removing of the inhibitor results in a gap that exposes a sidewall surface of the CESL, a bottom surface of the dielectric liner layer, and a top surface of the silicide feature. In further embodiments, the one or more metallic materials fill the gap.

In another example aspect, the present disclosure is directed to a method. The method includes providing a structure that includes a substrate; an isolation structure over the substrate; a fin extending from the substrate; an epitaxial source/drain (S/D) feature on the fin; a contact etch stop layer (CESL) covering a top surface of the isolation structure and surfaces of the S/D feature; and an inter-level dielectric (ILD) layer over the CESL. The method further includes etching a contact hole over the S/D feature, wherein the contact hole penetrates through the ILD layer and the CESL and exposes the S/D feature; forming a silicide feature on the S/D feature that is exposed in the contact hole; selectively depositing an inhibitor on the silicide feature, wherein the inhibitor is not deposited on surfaces of the ILD layer and the CESL; selectively depositing a dielectric liner layer on sidewalls and top surfaces of the contact hole, wherein the dielectric liner layer is not deposited on the inhibitor; and removing the inhibitor to expose the silicide feature in the contact hole.

In some embodiments, after the removing of the inhibitor, the method further includes depositing one or more metallic layers into the contact hole and performing a chemical-mechanical planarization (CMP) process to the one or more metallic layers. In some embodiments, after the performing of the CMP process, the method further includes recessing the one or more metallic layers and after the recessing, depositing a dielectric cap on the one or more metallic layers. In a further embodiment, the dielectric cap includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi.

In some embodiments of the method, the inhibitor includes an organic film having amphiphilic molecules and the dielectric liner layer includes $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, or ZrSi. In further embodiments, the CESL includes silicon nitride, silicon carbonitride, silicon oxycarbide, silicon carbide, or silicon oxy-carbonitride and the ILD layer includes silicon dioxide.

In yet another example aspect, the present disclosure is directed to a device that includes a substrate; a gate structure over the substrate; gate spacers on sidewalls of the gate structure; a contact etch stop layer (CESL) on sidewalls of the gate spacers; a dielectric cap over the gate structure; a source/drain (S/D) feature adjacent to the gate spacers; a silicide feature on the S/D feature; a dielectric liner on sidewalls of the CESL, wherein a bottom surface of the dielectric liner is spaced away from the silicide feature by a gap; and a S/D contact over the silicide feature and filling the gap.

In an embodiment of the device, the gap narrows as it approaches the CESL. In an embodiment, a height of the gap is in a range of 1 nm to 30 nm. In an embodiment, the S/D contact directly contacts a side surface of the CESL and the bottom surface of the dielectric liner. In some embodiments, the device further includes another dielectric cap directly over the S/D contact and on a sidewall of the dielectric liner.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a substrate;
   an isolation structure over the substrate;
   a gate structure over the isolation structure;
   a gate spacer on a sidewall of the gate structure;
   a source/drain (S/D) region adjacent to the gate spacer;
   a silicide layer on the S/D region; and
   a dielectric liner on a sidewall of the gate spacer and on a top surface of the isolation structure, wherein a bottom surface of the dielectric liner is above a top surface of the silicide layer and spaced away from the top surface of the silicide layer in a cross-sectional plane perpendicular to a lengthwise direction of the gate structure.

2. The device of claim 1, wherein a distance between the bottom surface of the dielectric liner and the top surface of the silicide layer is in a range of about 1 nm to 30 nm.

3. The device of claim 1, further comprising:
   an S/D contact over the silicide layer, wherein a portion of the S/D contact is disposed between the bottom surface of the dielectric liner and the top surface of the silicide layer.

4. The device of claim 3, wherein the silicide layer is U-shaped having a horizontal portion and two vertical portions, and a portion of the S/D contact is sandwiched between the two vertical portions.

5. The device of claim 3, further comprising:
   a first dielectric cap over the gate structure; and
   a second dielectric cap over the S/D contact,
   wherein the dielectric liner separates the first dielectric cap from the second dielectric cap.

6. The device of claim 5, wherein the first dielectric cap has a top portion over a bottom portion, and the top portion is wider than the bottom portion.

7. The device of claim 1, wherein the bottom surface of the dielectric liner has a rounded profile.

8. The device of claim 7, wherein the rounded profile curves from a highest point of the bottom surface to a lowest point of the bottom surface, and a distance between the highest point to the lowest point is in a range of about 1 nm to 30 nm.

9. The device of claim 1, wherein the dielectric liner is a first dielectric liner, further comprising:
   a second gate structure over the substrate;
   a second gate spacer on a sidewall of the second gate structure, wherein the S/D region is between the gate spacer and the second gate spacer; and
   a second dielectric liner on a sidewall of the second gate spacer and on the top surface of the isolation structure, wherein a bottom surface of the second dielectric liner is above the top surface of the silicide layer and is separated from the top surface of the silicide layer in the cross-sectional plane.

10. The device of claim 9,
    wherein a first gap between the bottom surface of the first dielectric liner and the top surface of the silicide layer has a first gap height,
    wherein a second gap between the bottom surface of the second dielectric liner and the top surface of the silicide layer has a second gap height, and the second gap height is greater than the first gap height.

11. The device of claim 1, wherein the dielectric liner and the gate spacer include different dielectric materials.

12. A device, comprising:
    a substrate;
    first and second gate structures over the substrate;
    first and second spacer layers on sidewalls of the first and the second gate structures, respectively;
    a source/drain (S/D) region between the first and the second gate structures and adjacent to the first and the second spacer layers;
    a silicide layer on the S/D region;
    first and second dielectric liners above and spaced away from a top surface of the silicide layer in a cross-sectional plane perpendicular to a lengthwise direction of the first and second gate structures and disposed on sidewalls of the first and the second spacer layers, respectively; and
    an S/D contact landing on the silicide layer,
    wherein the S/D contact is in direct contact with the silicide layer, the first and the second dielectric liners, and the first and the second spacer layers.

13. The device of claim 12,
    wherein the first dielectric liner is spaced away from the top surface of the silicide layer at a first gap height,
    wherein the second dielectric liner is spaced away from the top surface of the silicide layer at a second gap height, and the second gap height is greater than the first gap height.

14. The device of claim 12, wherein the first and the second dielectric liners have curved bottom surfaces.

15. The device of claim 12,
    wherein the first and the second spacer layers each include a gate spacer and a contact etch stop layer (CESL) along a sidewall of the gate spacer,
    wherein the S/D contact directly contacts the CESL of the first and second spacer layers.

16. A device, comprising:
    a substrate;
    a gate structure over the substrate;
    gate spacers on sidewalls of the gate structure;
    a contact etch stop layer (CESL) on sidewalls of the gate spacers;
    a dielectric liner on sidewalls of the CESL;
    a source/drain (S/D) region adjacent to the gate spacers;
    a silicide layer on the S/D region; and
    an S/D contact over the silicide layer,
    wherein portion of the S/D contact is disposed vertically between a bottom surface of the dielectric liner and a top surface of the silicide layer.

17. The device of claim 16, wherein the S/D contact directly contacts a side surface of the CESL and the bottom surface of the dielectric liner.

18. The device of claim 16, wherein the CESL is directly above a portion of the silicide layer.

19. The device of claim 16, further comprising a gate dielectric cap over the gate structure, and the dielectric liner is on a sidewall of the gate dielectric cap.

20. The device of claim 19, wherein a bottom portion of the gate dielectric cap is disposed between the gate spacers.

* * * * *